(12) United States Patent
Song et al.

(10) Patent No.: US 11,552,055 B2
(45) Date of Patent: Jan. 10, 2023

(54) INTEGRATED CIRCUIT (IC) PACKAGES EMPLOYING FRONT SIDE BACK-END-OF-LINE (FS-BEOL) TO BACK SIDE BACK-END-OF-LINE (BS-BEOL) STACKING FOR THREE-DIMENSIONAL (3D) DIE STACKING, AND RELATED FABRICATION METHODS

(71) Applicant: QUALCOMM Incorporated, San Diego, CA (US)

(72) Inventors: Stanley Seungchul Song, San Diego, CA (US); Bharani Chava, Cork City (IE)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/100,060

(22) Filed: Nov. 20, 2020

(65) Prior Publication Data
US 2022/0165707 A1  May 26, 2022

(51) Int. Cl.
*H01L 25/065* (2006.01)
*H01L 23/538* (2006.01)
(Continued)

(52) U.S. Cl.
CPC ...... *H01L 25/0657* (2013.01); *H01L 23/5385* (2013.01); *H01L 23/5389* (2013.01);
(Continued)

(58) Field of Classification Search
CPC ............. H01L 25/0657; H01L 23/5385; H01L 23/5389; H01L 24/08; H01L 24/09;
(Continued)

(56) References Cited

U.S. PATENT DOCUMENTS 7,847,386 B1  12/2010  Kim et al.
2019/0067244 A1*  2/2019  Chen ................... H01L 24/08
(Continued)

OTHER PUBLICATIONS

Invitation to Pay Additional Fees and Partial International Search for International Patent Application No. PCT/US2021/071915, dated Feb. 24, 2022, 17 pages.
(Continued)

*Primary Examiner* — Thanh Y. Tran
(74) *Attorney, Agent, or Firm* — W&T

(57) ABSTRACT

Integrated circuit (IC) packages employing front side back-end-of-line (FS-BEOL) to back side back-end-of-line (BS-BEOL) stacking for three-dimensional (3D) die stacking. To facilitate providing additional electrical routing paths for die-to-die interconnections between stacked IC dice in the IC package, a BS-BEOL metallization structure of a first die of the stacked dice of the IC package is stacked adjacent to a FS-BEOL metallization structure of a second die of the stacked IC dice. Electrical routing paths for die-to-die interconnections between the stacked IC dice are provided from the BS-BEOL metallization structure of the first die to the FS-BEOL metallization structure of the second die. It may be more feasible to form shorter electrical routing paths in the thinner BS-BEOL metallization structure than in a FS-BEM metallization structure for lower-resistance and/or lower-capacitance die-to-die interconnections for faster and/or compatible performance of semiconductor devices in the IC dice.

30 Claims, 16 Drawing Sheets

(51) Int. Cl.
  *H01L 23/00* (2006.01)
  *H01L 25/18* (2006.01)
  *H01L 25/00* (2006.01)
(52) U.S. Cl.
  CPC .............. *H01L 24/08* (2013.01); *H01L 24/09* (2013.01); *H01L 25/0652* (2013.01); *H01L 25/18* (2013.01); *H01L 25/50* (2013.01); *H01L 2224/08145* (2013.01); *H01L 2224/09181* (2013.01); *H01L 2225/06524* (2013.01); *H01L 2225/06565* (2013.01)
(58) Field of Classification Search
  CPC ..... H01L 25/0652; H01L 25/18; H01L 25/50; H01L 2224/08145; H01L 2224/09181; H01L 2225/06524; H01L 2225/06565
  See application file for complete search history.

(56) References Cited

U.S. PATENT DOCUMENTS

2019/0067252 A1* 2/2019 Veches ................... H01L 23/642
2021/0118847 A1* 4/2021 Chuang ................... H01L 25/03

OTHER PUBLICATIONS

International Search Report and Written Opinion for International Patent Application No. PCT/US2021/071915, dated Apr. 21, 2022, 24 pages.

* cited by examiner

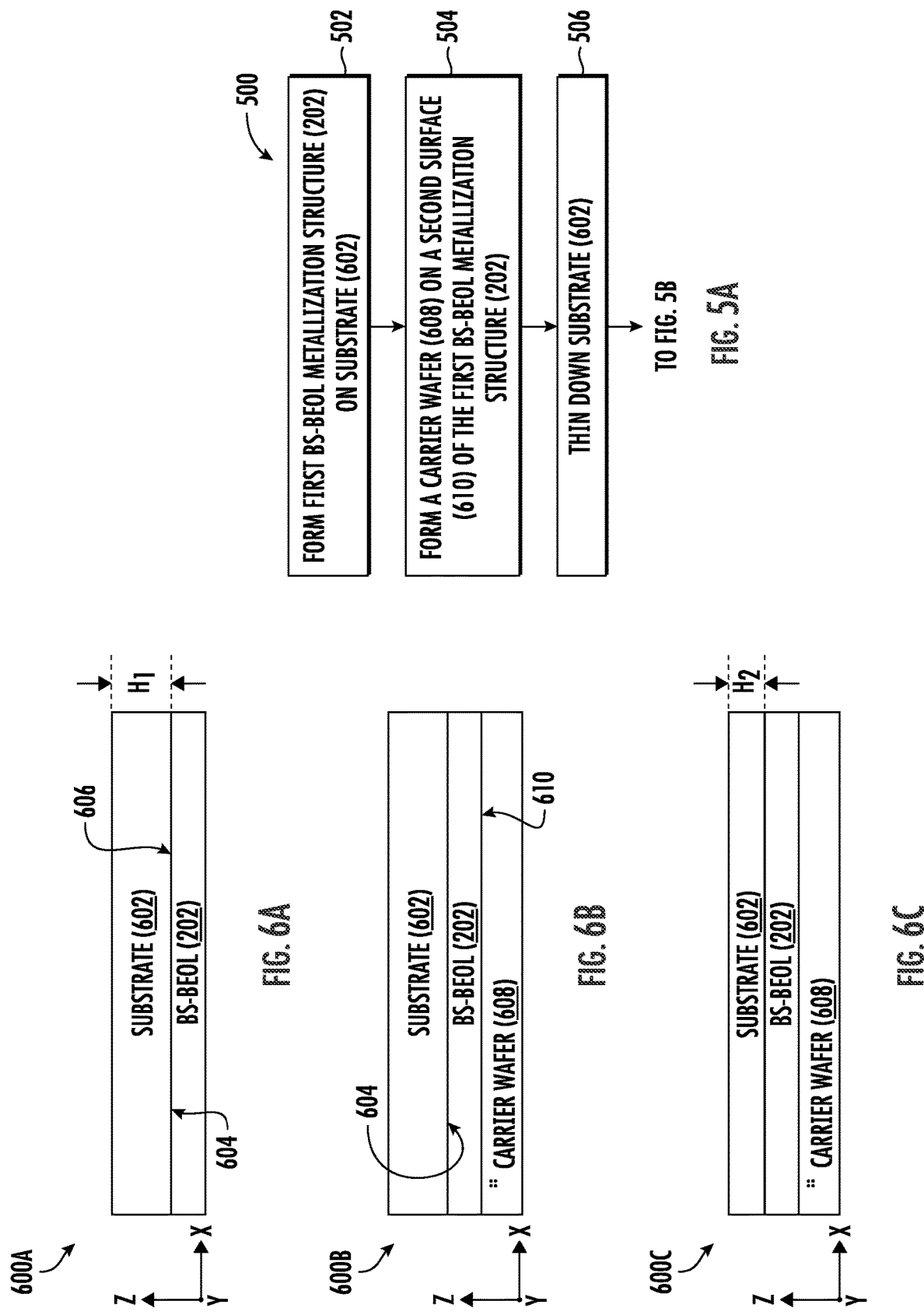

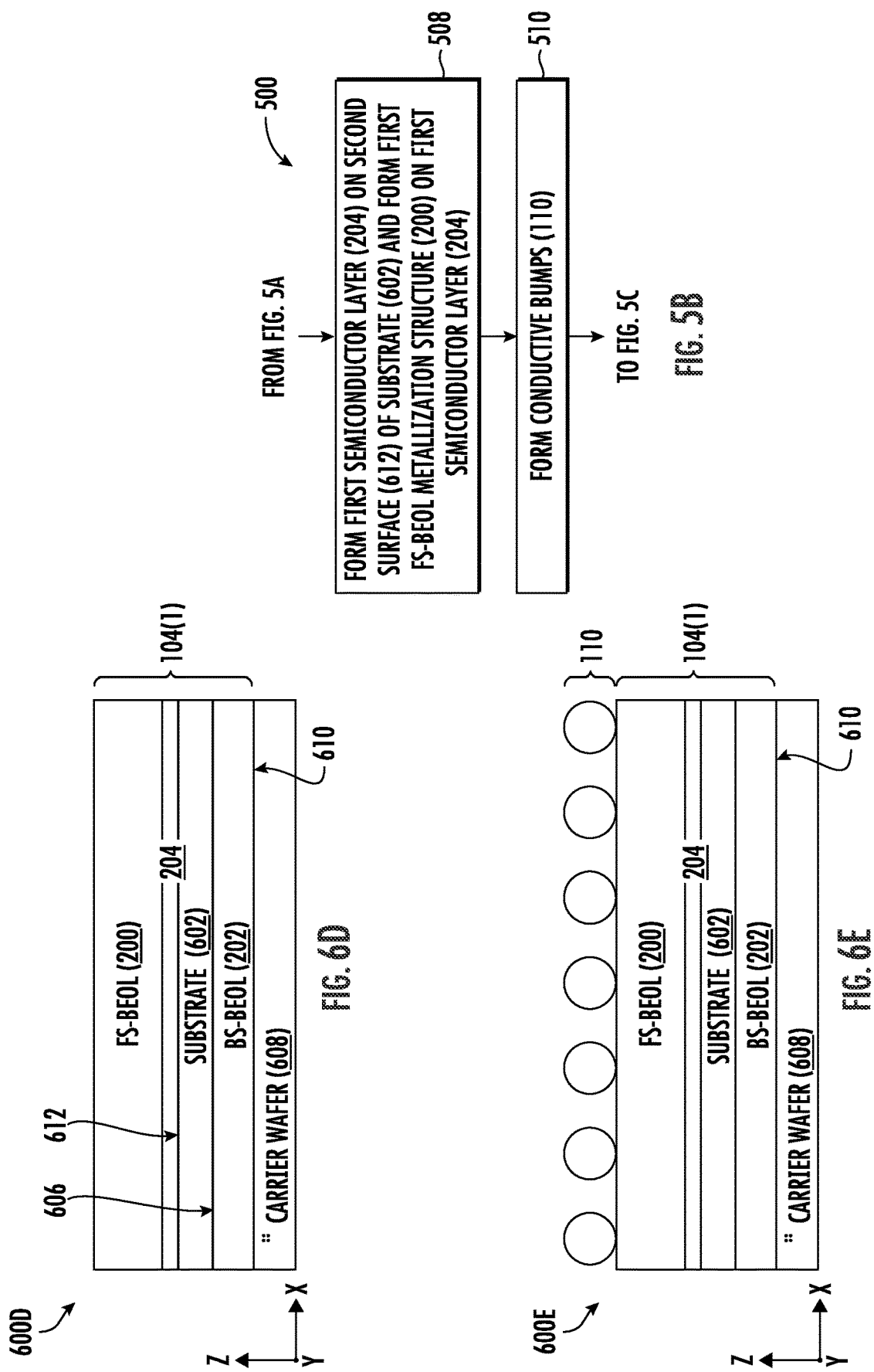

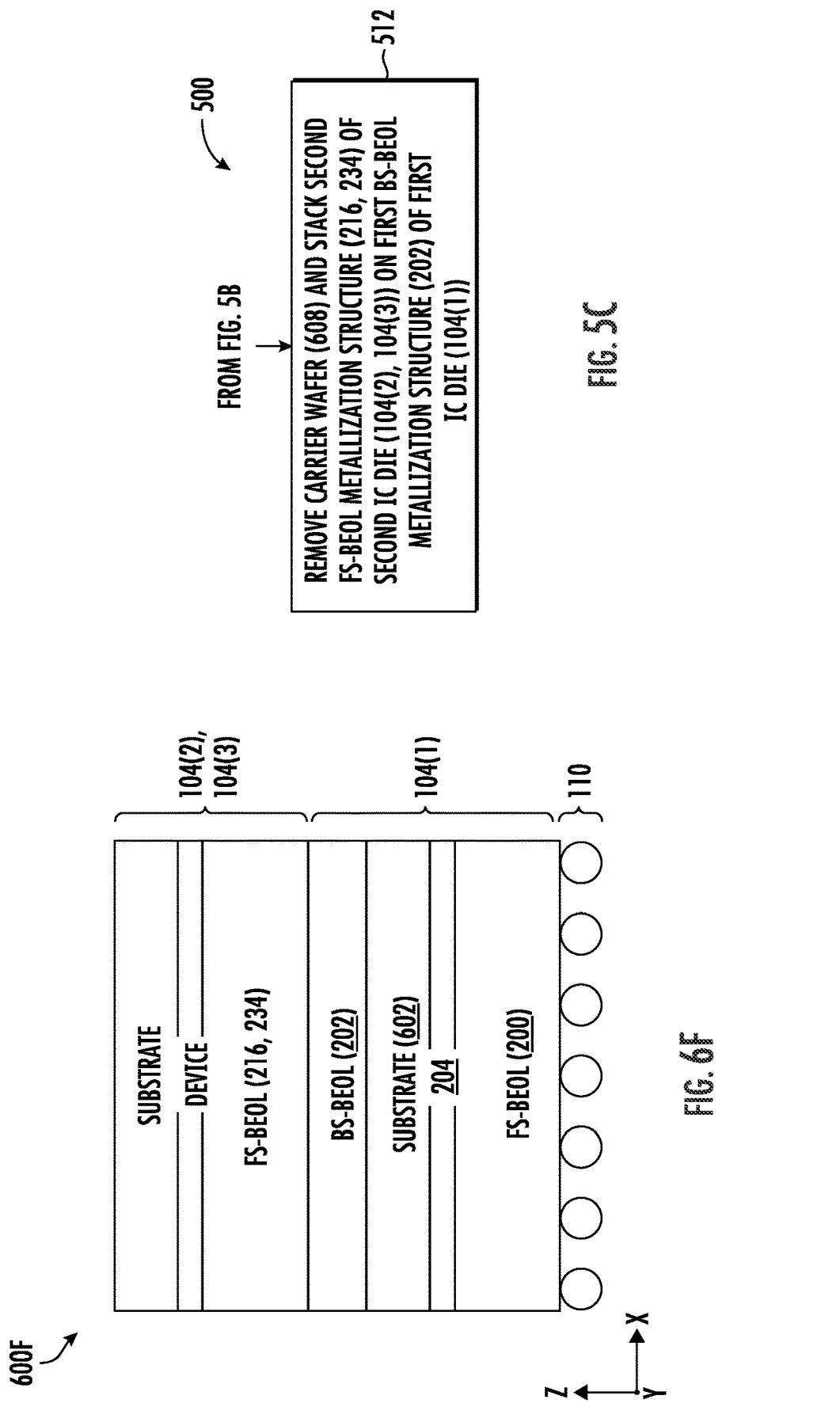

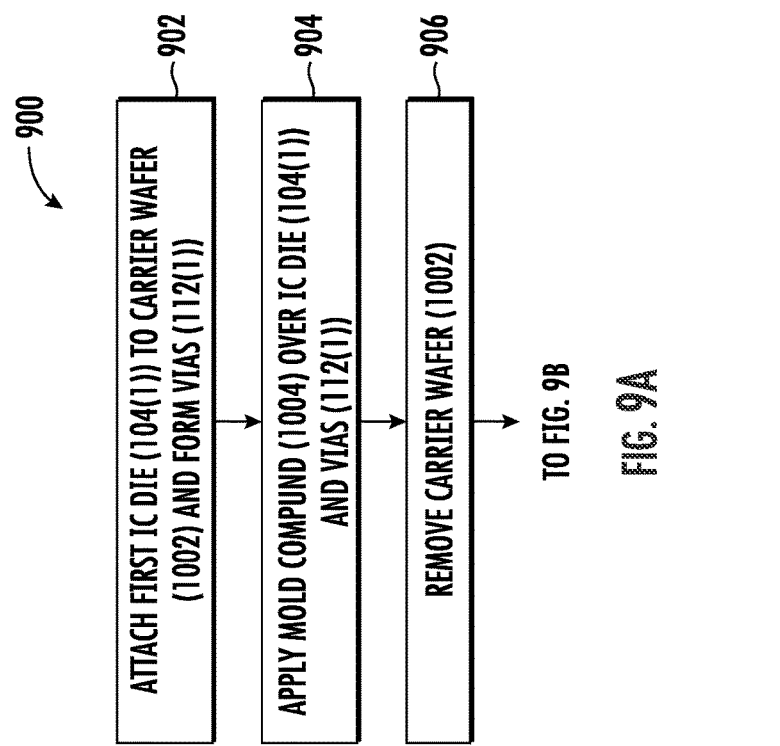
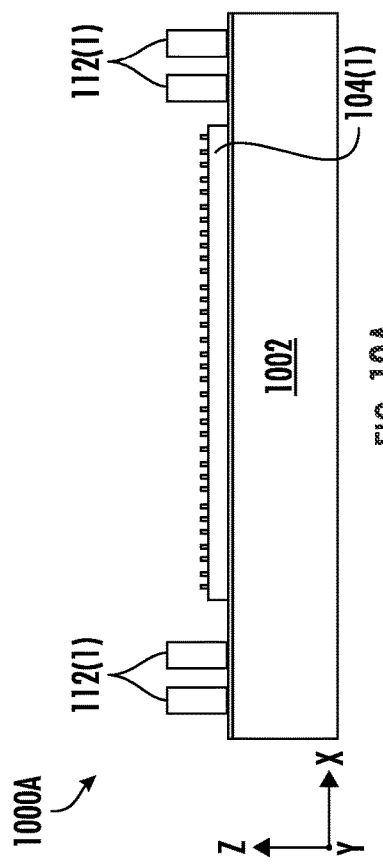
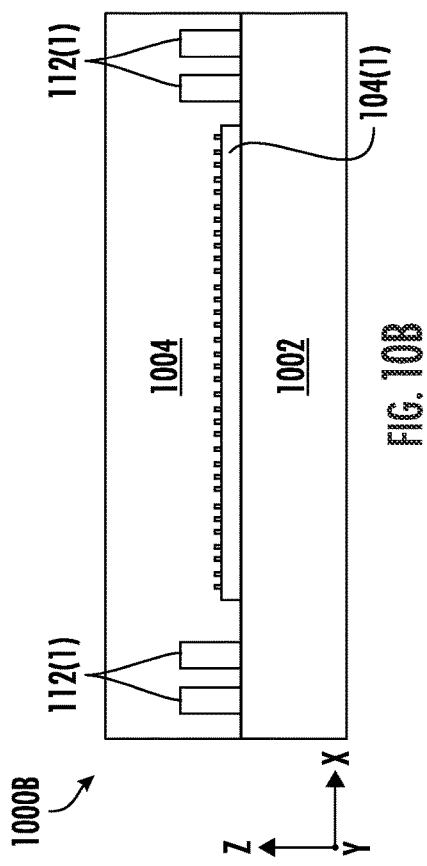
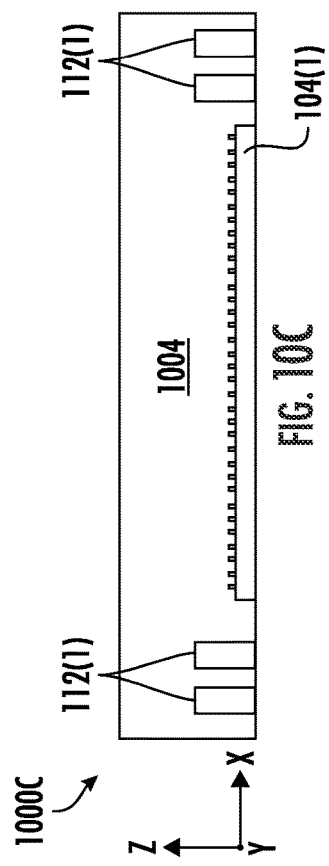

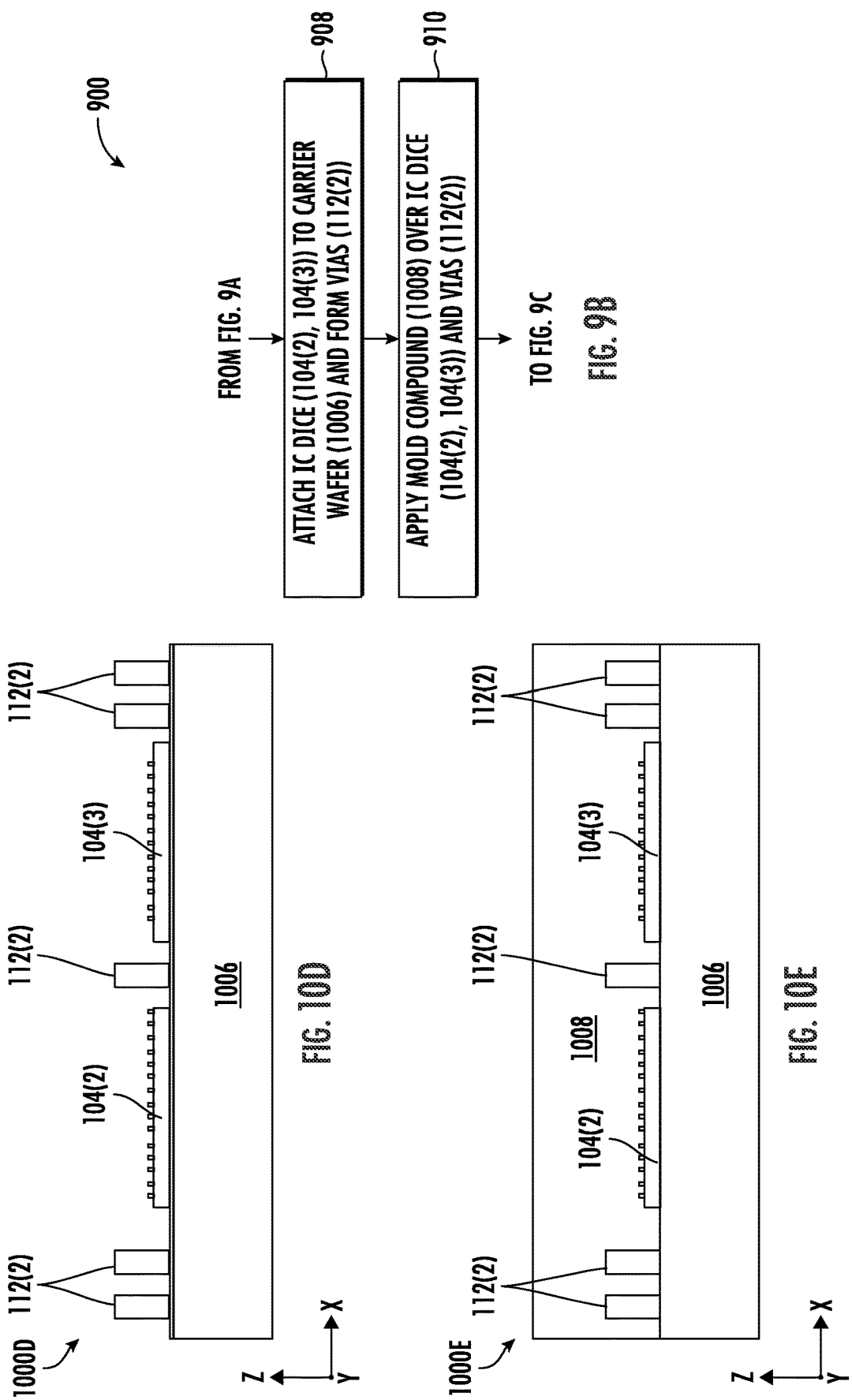

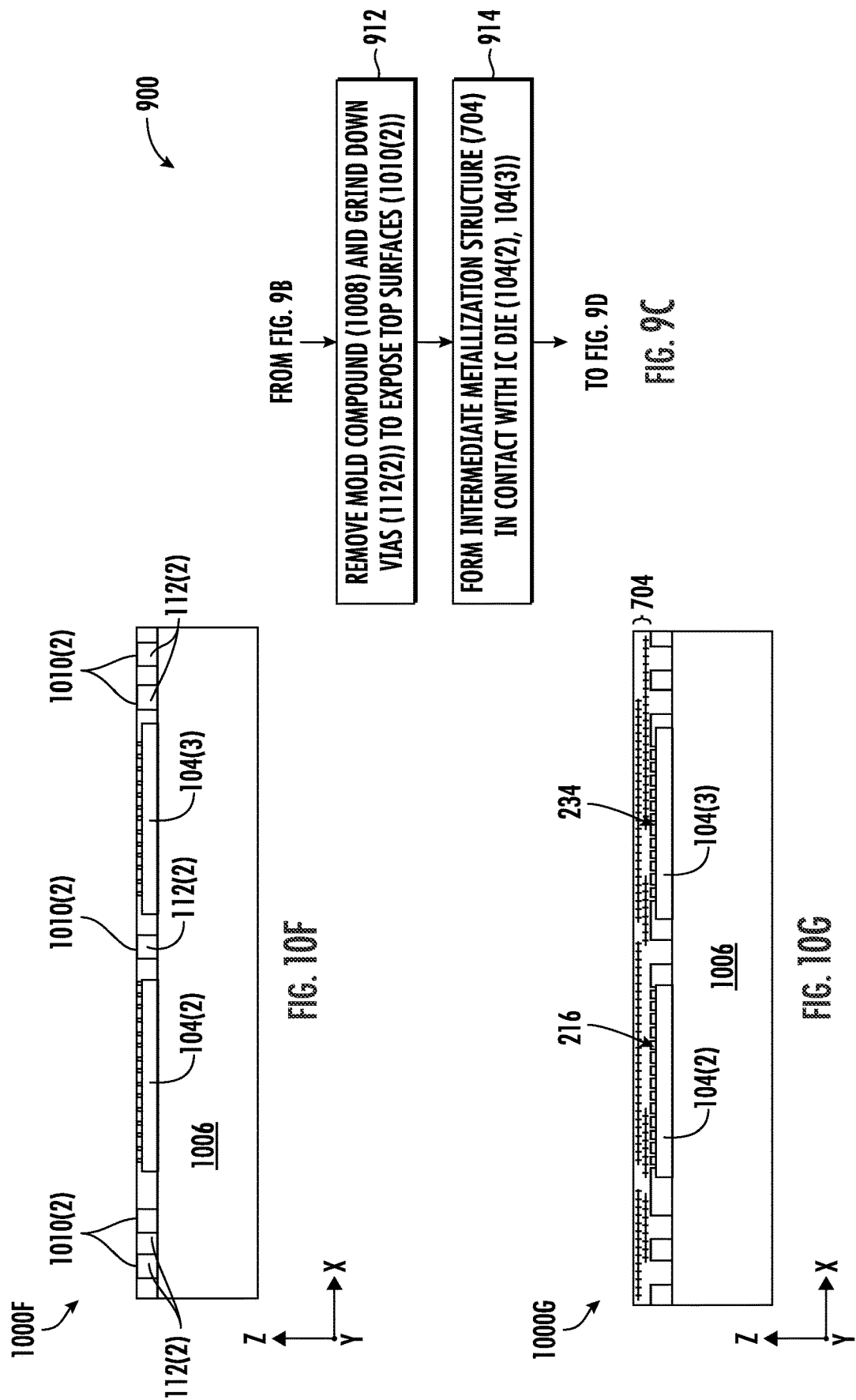

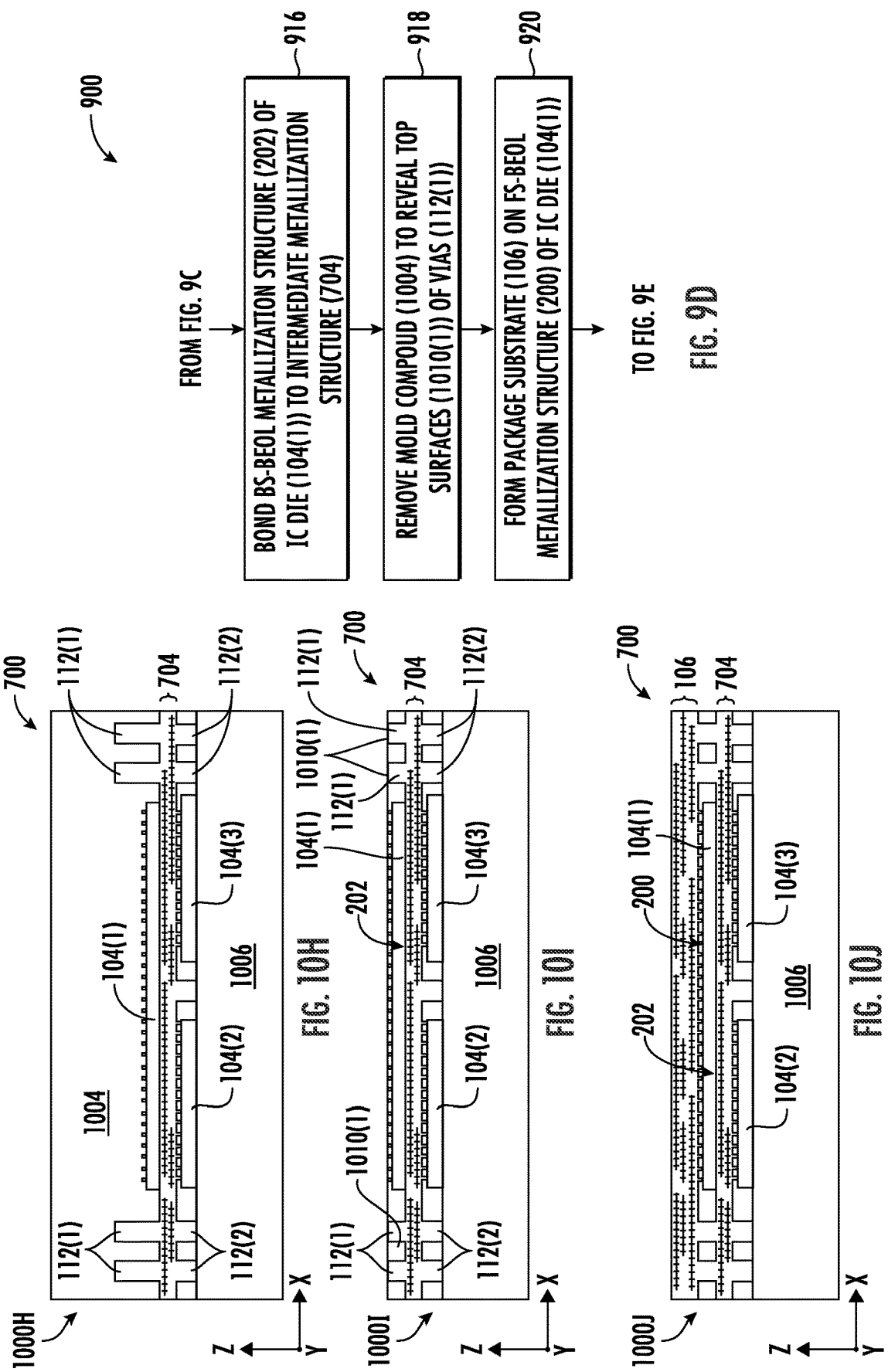

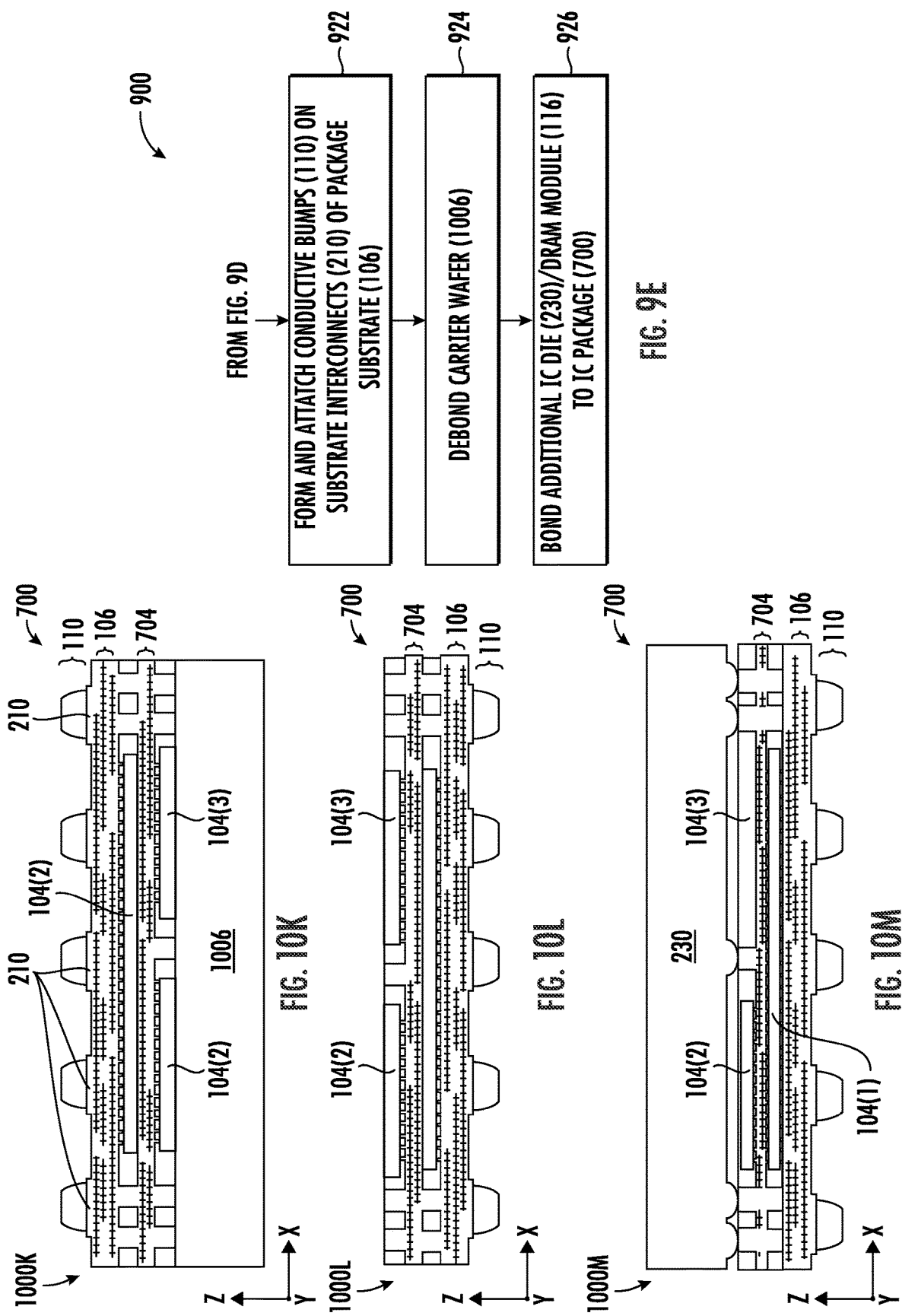

INTEGRATED CIRCUIT (IC) PACKAGES EMPLOYING FRONT SIDE BACK-END-OF-LINE (FS-BEOL) TO BACK SIDE BACK-END-OF-LINE (BS-BEOL) STACKING FOR THREE-DIMENSIONAL (3D) DIE STACKING, AND RELATED FABRICATION METHODS

BACKGROUND

I. Field of the Disclosure

The field of the disclosure relates to integrated circuit (IC) packages that include a die module employing stacked semiconductor dice coupled to a package substrate that provides an electrical interface to the semiconductor dice.

II. Background

Integrated circuits (ICs) are the cornerstone of electronic devices. ICs are packaged in an IC package, also called a "semiconductor package" or "chip package." The IC package includes one or more semiconductor dice as an IC(s) that are mounted on and electrically coupled to a package substrate to provide physical support and an electrical interface to the semiconductor die(s). The IC package may also include three-dimensional (3D) stacked semiconductor dice in a die module that is coupled to a package substrate. The package substrate may be an embedded trace substrate (ETS), for example, that includes embedded electrical traces in one or more dielectric layers and vertical interconnect accesses (vias) coupling the electrical traces together to provide electrical interfaces between the semiconductor die(s). The package substrate may also be formed as redistribution layers (RDLs). The semiconductor dies) is mounted to and electrically-interfaced to interconnects exposed in a top layer of the package substrate to electrically couple the semiconductor die(s) to the electrical traces of the package substrate.

The semiconductor die(s) and package substrate are encapsulated in a package material, such as a molding compound, to form the IC package. The IC package may also include external solder bumps in a ball grid array (BGA) that are electrically coupled to interconnects exposed in a bottom layer of the package substrate to electrically couple the solder bumps to the electrical traces in the package substrate. The solder bumps provide an external electrical interface to the semiconductor die(s) in the IC package. The solder bumps are electrically coupled to metal contacts on a printed circuit board (PCB) when the IC package is mounted to the PCB to provide an electrical interface between electrical traces in the PCB to the IC chip through the package substrate in the IC package.

SUMMARY OF THE DISCLOSURE

Aspects disclosed herein include integrated circuit (IC) packages employing front side back-end-of-line (FS-BEOL) to back side back-end-of-line (BS-BEOL) stacking for three-dimensional (3D) die stacking. Related chip packages and methods of fabricating the IC package are also disclosed. The IC package includes a die module that includes at least two (2), three-dimensional (3D) stacked semiconductor dice (also referred to individually as "IC die" or "die"). The FS-BEOL and BS-BEOL metallization structures are metallization structures that include one or more metal layers that include electrical interconnects for routing of electrical signals to the semiconductor layer for die interconnections. The FS-BEOL is a metallization structure disposed adjacent to a front side of a semiconductor layer of an IC die. The BS-BEOL is another metallization structure disposed adjacent to a back side of a semiconductor layer of an IC die. The IC die module is also coupled to a metallization structure (e.g., an embedded track substrate (ETS) or redistribution layers (RDLs)) that can provide external electrical routing to the IC dice as well as internal die-to-die routing between the IC dice. Electrical routing paths can be formed through the package substrate to provide die-to-die interconnections between the stacked dice.

To facilitate providing primary and/or additional electrical routing paths for die-to-die interconnections between the stacked IC dice, in exemplary aspects, a BS-BEM, metallization structure of a first die of the stacked IC dice of the IC package is stacked adjacent to a FS-BEOL metallization structure of a second die of the stacked IC dice. Electrical routing paths for die-to-die interconnections between the stacked IC dice are provided from the BS-BEOL metallization structure of the first die to the FS-BEOL metallization structure of the second die. The BS-BEOL metallization structure is typically a thinner structure than a FS-BEOL metallization structure. Thus, it may be more feasible to form electrical routing structures (e.g., through-silicon-vias (TSVs)) in the BS-BEOL metallization structure than in a FS-BEOL metallization structure. Also electrical routing from the thinner BS-BEOL metallization structure of the first die to the second die allows for providing shorter electrical routing paths between the first and second IC dice for die-to-die interconnections. Providing shorter electrical routing paths for die-to-die interconnections can provide lower-resistance and/or lower-capacitance die-to-die interconnections for faster and/or compatible performance of semiconductor devices in the IC dice.

In another exemplary aspect, to provide additional electrical routing flexibility in the IC package, the IC module can further include an intermediate metallization structure formed between the BS-BEOL metallization structure of the first die and the FS-BEOL metallization structure of the second die. The intermediate metallization structure may comprise one or more RDLs for example. The intermediate metallization structure facilitates relocation of die-to-die interconnections between the BS-BEOL metallization structure of the first die and the FS-BEOL metallization structure of the second IC die for greater die-to-die electrical routing flexibility and die connection density. The intermediate metallization structure can also facilitate forming additional electrical routing paths adjacent to an IC die of the stacked IC dice and through the intermediate metallization structure. For example, there may be available white or gap space in the IC package adjacent to an IC die of the stacked IC dice and that can support additional electrical routing structures to provide additional electrical routing paths in the IC package. These additional electrical routing structures can be routed through the intermediate metallization structure to facilitate additional die interconnections to a die(s) in the stacked dice.

In this regard, in one exemplary aspect, an IC package is provided. The IC package comprises a first IC die. The first IC die comprises a first FS-BEOL metallization structure. The first IC die also comprises a first BS-BEOL metallization structure. The first IC die also comprises a first semiconductor layer disposed between the first FS-BEOL metallization structure and the first BS-BEOL metallization structure. The IC package also comprises a second IC die. The second IC die comprises a second FS-BEOL metallization structure adjacent to the first BS-BEOL metallization structure. The second IC die also comprises a second BS-BEOL metallization structure. The second IC die also comprises a second semiconductor layer disposed between the second FS-BEM metallization structure and the second BS-BEOL metallization structure.

In another exemplary aspect, a method of fabricating an IC package is provided. The method comprises forming a first IC die comprising forming a first BS-BEOL metallization structure, forming a first semiconductor layer adjacent to the first BS-BEOL metallization structure, and forming a first FS-BEOL metallization structure adjacent to the first semiconductor layer such that the first semiconductor layer is disposed between the first BS-BEOL metallization structure and the first FS-BEOL metallization structure. The method also comprises forming a second IC die comprising forming a second BS-BEOL metallization structure, forming a second semiconductor layer adjacent to the second BS-BEOL metallization structure, and forming a second FS-BEOL metallization structure adjacent to the second semiconductor layer such that the second semiconductor layer is disposed between the second BS-BEOL metallization structure and the second FS-BEOL metallization structure.

BRIEF DESCRIPTION OF THE FIGURES

FIGS. 5A-5C are a flowchart illustrating another exemplary process of fabricating an IC die that can facilitate FS-BEOL metallization structure to BS-BEOL metallization structure stacking in an IC package to provide 3D die stacking;

FIGS. 6A-6F illustrate exemplary fabrication stages for the process in FIGS. 5A-5C;

FIGS. 9A-9E are a flowchart illustrating another exemplary process of fabricating an IC package employing an IC die module employing FS-BEOL metallization structure to BS-BEOL metallization structure stacking to provide 3D die stacking, wherein the IC die module also includes an intermediate metallization layer disposed between the FS-BEOL and BS-BEOL metallization structures to facilitate die-to-die interconnections, including, but not limited to, the IC package in FIGS. 7 and 8;

FIGS. 10A-10M illustrate exemplary fabrication stages during fabrication of an IC package employing an IC die module employing FS-BEM metallization structure to BS-BEOL metallization structure stacking to provide 3D die stacking, according to the process in FIGS. 9A-9E;

DETAILED DESCRIPTION

Figure 1:
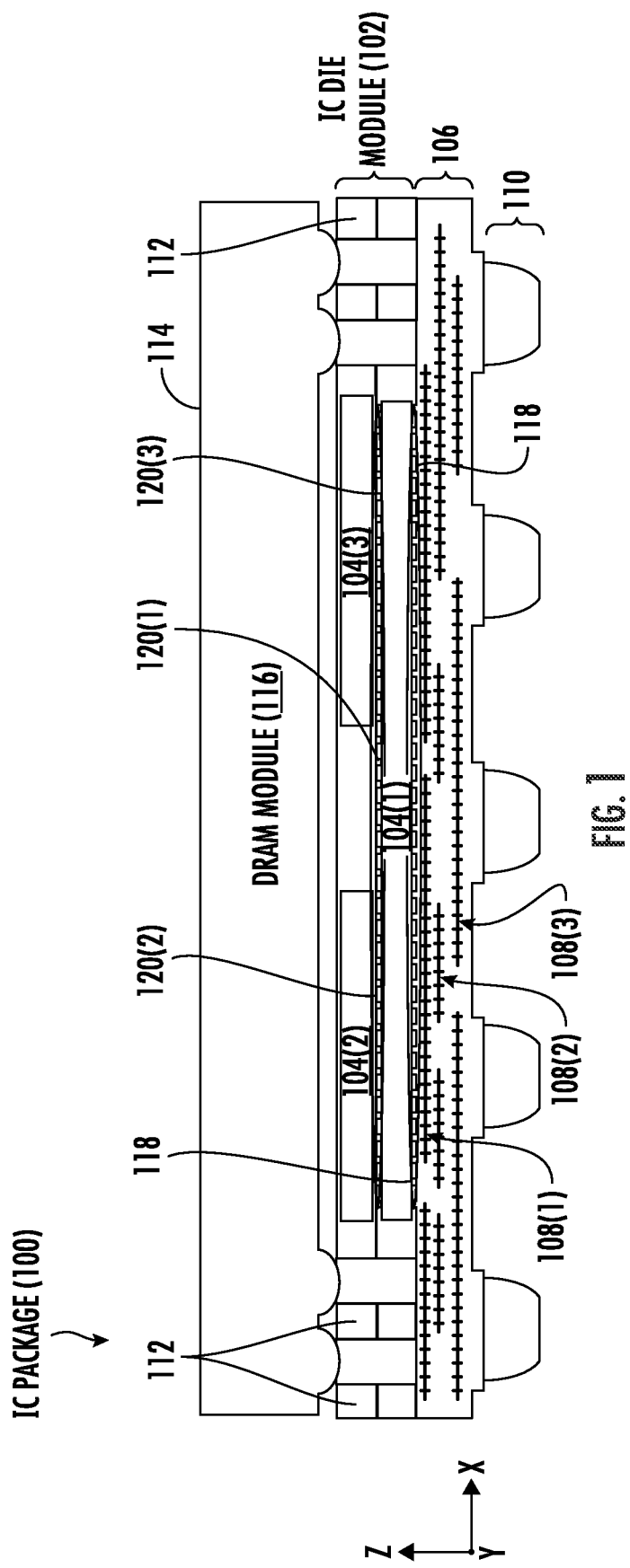
FIG. 1 is a side view of an exemplary integrated circuit (IC) package employing a semiconductor die ("IC die") module employing front side (FS)-back-end-of-line (BEOL) (FS-BEOL) metallization structure to back side (BS)-BEOL (BS-BEOL) metallization structure stacking for three-dimensional (3D) die stacking to facilitate die-to-die interconnections.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing front side back-end-of-line (FS-BEOL) to back side back-end-of-line (BS-BEOL) stacking for three-dimensional (3D) die stacking. Related chip packages and methods of fabricating the IC package are also disclosed. The IC package includes a die module that includes at least two (2), three-dimensional (3D) stacked semiconductor dice (also referred to individually as "IC die" or "die"). The FS-BEOL and BS-BEOL metallization structures are metallization structures that include one or more metal layers that include electrical interconnects for routing of electrical signals to the semiconductor layer for die interconnections. The FS-BEOL is a metallization structure disposed adjacent to a front side of a semiconductor layer of an IC die. The BS-BEOL is another metallization structure disposed adjacent to a back side of a semiconductor layer of an IC die. The IC die module is also coupled to a metallization structure (e.g., an embedded track substrate (ETS) or redistribution layers (RDLs)) that can provide external electrical routing to the IC dice as well as internal die-to-die routing between the IC dice. Electrical routing paths can be formed through the package substrate to provide die-to-die interconnections between the stacked dice.

To facilitate providing primary and/or additional electrical routing paths for die-to-die interconnections between the stacked IC dice, in exemplary aspects, a BS-BEOL metallization structure of a first die of the stacked IC dice of the IC package is stacked adjacent to a FS-BEOL metallization structure of a second die of the stacked IC dice. Electrical routing paths for die-to-die interconnections between the stacked IC dice are provided from the BS-BEOL metallization structure of the first die to the FS-BEOL metallization structure of the second die. The BS-BEOL metallization structure is typically a thinner structure than a FS-BEOL metallization structure. Thus, it may be more feasible to form electrical routing structures (e.g., through-silicon-vias (TSVs)) in the BS-BEOL metallization structure than in a FS-BEOL metallization structure. Also electrical routing from the thinner BS-BEOL metallization structure of the first die to the second die allows for providing shorter electrical routing paths between the first and second IC dice for die-to-die interconnections. Providing shorter electrical routing paths for die-to-die interconnections can provide lower-resistance and/or lower-capacitance die-to-die interconnections for faster and/or compatible performance of semiconductor devices in the IC dice.

In another exemplary aspect, to provide additional electrical routing flexibility in the IC package, the IC module can further include an intermediate metallization structure formed between the BS-BEOL metallization structure of the first die and the FS-BEOL metallization structure of the second die. The intermediate metallization structure may comprise one or more RDLs for example. The intermediate metallization structure facilitates relocation of die-to-die interconnections between the BS-BEOL metallization structure of the first die and the FS-BEOL metallization structure of the second IC die for greater die-to-die electrical routing flexibility and die connection density. The intermediate metallization structure can also facilitate forming additional electrical routing paths adjacent to an IC die of the stacked IC dice and through the intermediate metallization structure. For example, there may be available white or gap space in the IC package adjacent to an IC die of the stacked IC dice and that can support additional electrical routing structures to provide additional electrical routing paths in the IC package. These additional electrical routing structures can be routed through the intermediate metallization structure to facilitate additional die interconnections to a die(s) in the stacked dice.

In this regard, FIG. 1 is a side view of an exemplary IC package 100 employing a semiconductor die module 102 (also referred to herein as "IC die module 102"). As shown in FIG. 1, the IC die module 102 includes a plurality of stacked IC dice 104(1)-104(3) in the Z-axis or vertical direction for 3D stacking. The IC die module 102 is disposed in a horizontal plane in the X-axis and Y-axis directions. The IC die module 102 is disposed on a package substrate 106 that is a metallization structure to provide external interconnections to the IC dice 104(1)-104(3). The package substrate 106 may be a laminated substrate or a redistribution layer (RDL) substrate as examples. The package substrate 106 can also facilitate providing die-to-die interconnections between the IC dice 104(1)-104(3). The package substrate 106 may be an embedded trace substrate (ETS) or formed as redistribution layers (RDLs) as examples. The package substrate 106 includes one or more metal interconnect layers 108(1)-108(3) of electrical traces that form interconnections for signal routing and vertical interconnect accesses (vias) to couple electrical traces together between different layers. The package substrate 106 also serves as a support structure on which the IC die module 102 can be disposed and supported. Conductive bumps 110 (e.g., solder bumps, ball grid array (BGA)) are formed in contact with interconnects in the bottom metal interconnect layer 108(3) of the package substrate 106 to provide an external electrical interface to the IC dice 104(1)-104(3). The package substrate 106 can be mounted to a printed circuit board (PCB) through the external conductive bumps 110 to provide a conductive routing path between the conductive bumps 110 and the IC dice 104(1)-104(3).

Vias 112 are also formed in the IC package 100 that are electrically coupled to a top metal interconnect layer 108(3) of the package substrate 106 to provide electrical routing paths through the package substrate 106 to the IC dice 104(1)-103(3).

In the exemplary IC package 100 in FIG. 1, the IC die 104(1) could be an application-specific die, such as a general processor as an example. One of IC dice 104(2), 104(3) could be a power management IC (PMIC) that controls power management functions for managing power to the IC die 104(1), as another example. Another of the IC dice 104(2). 104(3) could be a specific processor, such as a modem or baseband processor, as another example. In the IC package 100 in FIG. 1, a die 114 in the form of a dynamic random access memory (DRAM) module 116 is provided and electrically coupled through vias 112 to the package substrate 106. The DRAM module 116 provides memory that is accessible to the IC die 104(1) through the electrical routing paths in the metal interconnect layers 108(1)-108(3) in the package substrate 106 electrically coupled to the DRAM module 116 through the vias 112. The IC die 104(1) is coupled to the metal interconnect layers 108(1)-208(3) in the package substrate 106 through die interconnects 118. Die-to-die interconnections can be made between the stacked IC dice 104(1)-104(3) between die interconnects 120(1)-120(3) that contact each other when the IC dice 104(1)-104(3) are bonded together.

Figure 2:
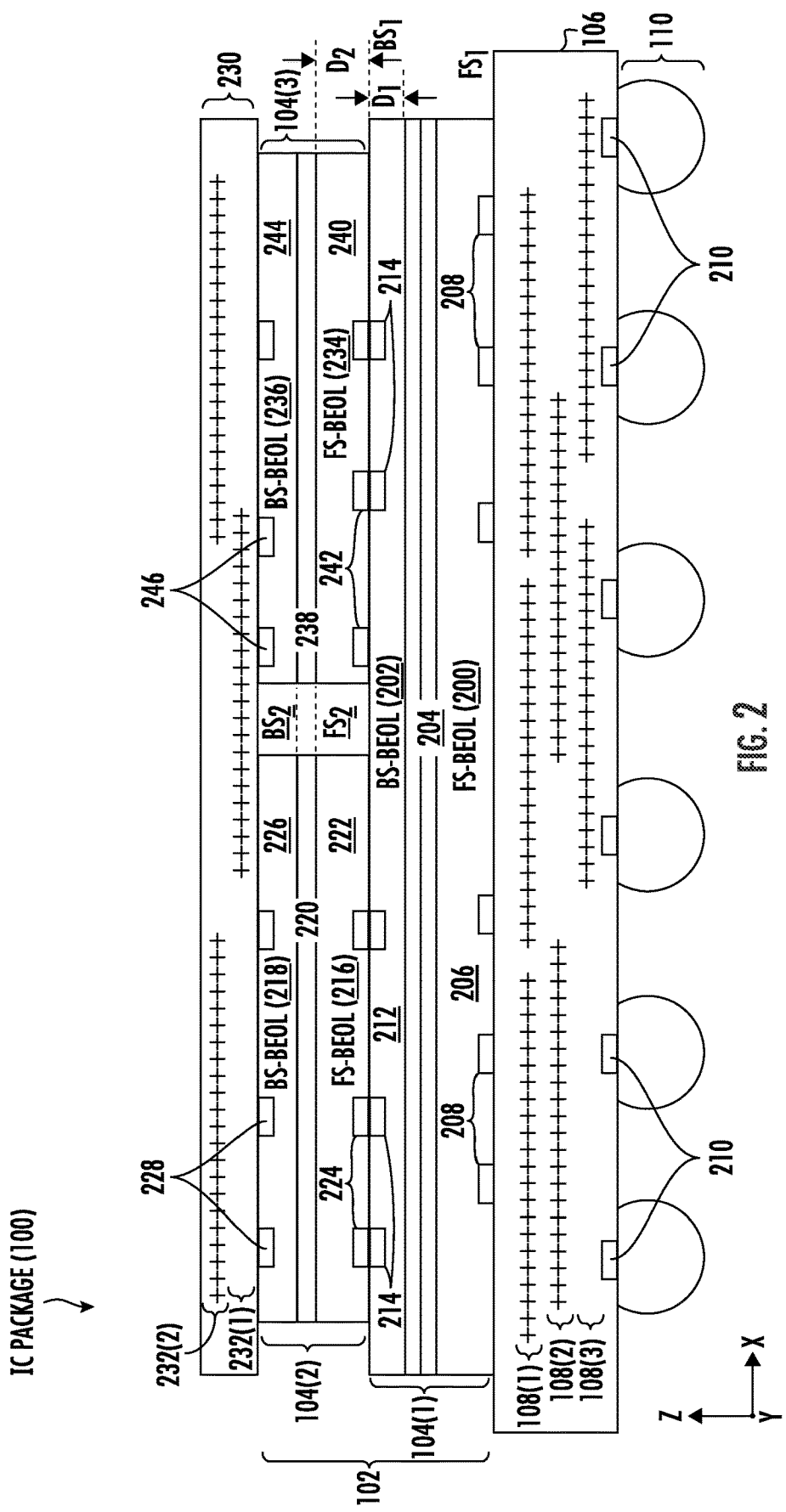
FIG. 2 is a side view of the IC package in FIG. 1 illustrating additional detail.

FIG. 2 is a side view of the IC package 100 in FIG. 1. As discussed below, the IC package 100 includes FS-BEOL metallization structure to BS-BEOL metallization structure stacking to provide 3D die stacking of the IC dice 104(1)-104(3) to facilitate improved die-to-die interconnections. In this regard, as shown in FIG. 2, the first, bottom IC die 104(1) in the IC die module 102 includes a FS-BEOL metallization structure 200 and a BS-BEOL metallization structure 202. The IC die 104(1) includes a semiconductor layer 204 disposed between the FS-BEOL metallization structure 200 and the BS-BEOL metallization structure 202 of the IC die 104(1). The semiconductor layer 204 is where active semiconductor devices are formed in the IC die 104(1), For example, the active semiconductor devices formed in the semiconductor layer 204 may be field-effect transistors (FETs). The FETs may be part of complementary metal-oxide semiconductor (CMOS) circuits that are formed in the semiconductor layer 204 as positive (P)-type FETs (PFETs) and negative (N)-type FETs (NFETs) for example. The FS-BEOL metallization structure 200 of the IC die 104(1) is adjacent to and disposed on the package substrate 106 in this example to provide electrical interfacing and mechanical support. The FS-BEOL metallization structure 200 is a metallization structure located on a front side $FS_1$ of the IC die 104(1). In this example, the FS-BEOL metallization structure 200 is disposed adjacent to a front side $F_1$ of the semiconductor layer 204. The FS-BEOL metallization structure 200 includes metal interconnect layers 206 that include metal lines for carrying electrical signals (e.g., input/output (110) signals, power signals) between the conductive bumps 110 and devices in the semiconductor layer 204 of the IC die 104(1). A BEOL is usually the second portion of an IC fabrication where individual active devices formed in the semiconductor layer 204 get interconnected to metal lines in the metal interconnect layers 206 for providing die connection interfacing. The FS-BEOL metallization structure 200 disposed on the front side $FS_1$ of the semiconductor layer 204 is formed in a front-end-of-line (FEOL) process for the IC die 104(1).

In this example, the FS-BEOL metallization structure 200 includes die interconnects 208 that are electrically coupled to the top metal interconnect layer 108(1) of the package substrate 106. The die interconnects 208 that are also electrically coupled to active semiconductor devices in the semiconductor layer 204 to provide a die interconnection to the IC die 104(1). Die interconnects 208 of the FS-BEOL metallization structure 200 can be electrically coupled through metal traces in the metal interconnect layer 108(1)-108(3) of the package substrate 106 to the conductive bumps 110 to facilitate external interconnections to the IC die 104(1). In this regard, the package substrate 106 includes substrate interconnects 210 that are electrically coupled to the bottom metal interconnect layer 108(3) and the conductive bumps 110 to form electrical connection paths between the conductive bumps 110 and the metal interconnect layers 108(1)-108(3).

With continuing reference to FIG. 2, the bottom IC die 104(1) in the IC die module 102 also includes the BS-BEOL metallization structure 202 on a back side $BS_1$ of the IC die 104(1). In this example, the BS-BEOL metallization structure 202 is disposed adjacent to the back side $BS_1$ of the semiconductor layer 204. The BS-BEOL metallization structure 202 is also formed in a FEOL process for the IC die 104(1). The BS-BEOL metallization structure 202 includes metal interconnect layers 212 that include metal lines for carrying electrical signals (e.g., input/output (I/O) signals, power signals) to semiconductor devices in the semiconductor layer 204 of the IC die 104(1). In this example, the BS-BEOL metallization structure 202 includes die interconnects 214 that are electrically coupled to active semiconductor devices in the semiconductor layer 204 to provide a die interconnection to the IC die 104(1) from the back side $BS_1$ of the IC die 104(1).

Note that the IC die 104(1) in the IC package 100 in FIG. 2 has been flipped such that the FS-BEOL metallization structure 200 is disposed beneath and adjacent to the front side $FS_1$ of the semiconductor layer 204 in the Z-axis direction in this example. The BS-BEOL metallization structure 202 is disposed above and adjacent to the back side $BS_1$ of the semiconductor layer 204 in the Z-axis direction in this example.

With continuing reference to FIG. 2, the IC die module 102 of the IC package 100 includes two other IC dice, which are IC dice 104(2) and 104(3). The IC dice 104(2) and 104(3) are stacked in the vertical, Z-axis direction on the IC die 104(1) for a 3D stacking arrangement. It is also desired to provide electrical interfaces to the IC dice 104(2), 104(3). These electrical interfaces can include external electrical interfacing through the package substrate 106 and conductive bumps 110. These electrical interfaces can also include die-to-die interconnections with and between other IC dice 104(1)-104(3).

In this regard, the second IC die 104(2) of the IC die module 102 in FIG. 2 includes a FS-BEOL metallization structure 216 and a BS-BEOL metallization structure 218. The IC die 104(2) also includes a semiconductor layer 220 disposed between the FS-BEOL metallization structure 216 and the BS-BEOL metallization structure 218 of the IC die 104(2). The semiconductor layer 220 is where active semiconductor devices are formed in the IC die 104(2). The FS-BEOL metallization structure 216 of the IC die 104(2) is adjacent to and disposed on the IC die 104(1) in this example in a stacked arrangement. For example, the IC die 104(2) can be bonded to the IC die 104(1) with a bond, such as a thermo-compression bond for example. The FS-BEOL metallization structure 216 is a metallization structure located on a front side $FS_2$ of the IC die 104(2). In this example, the FS-BEM metallization structure 216 is disposed adjacent to the front side $FS_2$ of the semiconductor layer 220. The FS-BEOL metallization structure 216 includes metal interconnect layers 222 that include metal lines for carrying electrical signals (e.g., input/output (I/O) signals, power signals) to semiconductor devices in the semiconductor layer 220 of the IC die 104(2). In this example, the FS-BEOL metallization structure 216 includes die interconnects 224 that are electrically coupled to the die interconnects 214 in the BS-BEOL metallization structure 202 of the IC die 104(1) to provide a die-to-die interconnect between the IC die 104(1) and the IC die 104(2).

Figure 3:
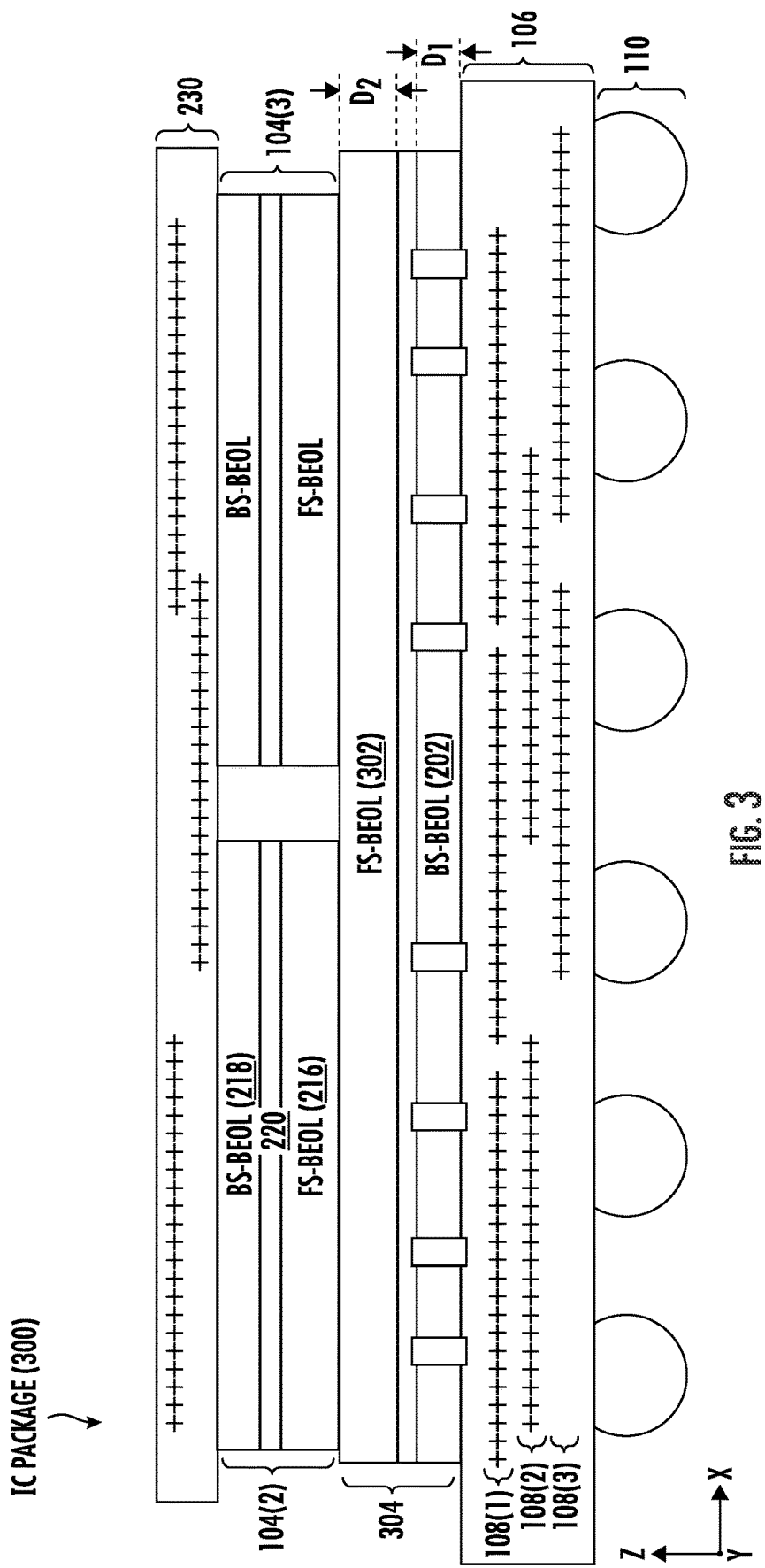
FIG. 3 is a side view of another exemplary IC package employing an IC die module employing FS-BEOL metallization structure to BS-BEOL metallization structure stacking to provide 3D die stacking.

In this example, the first and second. IC dice 104(1) and 104(2) are arranged such that the BS-BEOL metallization structure 202 of the first IC die 104(1) is located adjacent to the FS-BEOL metallization structure 216 of the second IC die 104(1) to provide a BS-BEOL metallization structure to FS-BEOL metallization structure stacking. The IC dice 104(1), 204(2) are stacked with a FS-BEOL metallization structure 216 to BS-BEOL metallization structure 202 stacking. This is opposed to the IC package 300 in FIG. 3 for example, that shows an alternative arrangement of the FS-BEOL metallization structure 216 of the IC die 104(2) stacked adjacent to a FS-metallization structure 302 of a bottom IC die 304. With reference back to FIG. 2, the electrical routing paths for die-to-die interconnections between the stacked. IC dice 104(1), 104(2) are provided from the BS-BEOL metallization structure 202 of the die 104(1) to the FS-BEOL metallization structure 216 of the second IC die 104(2). A BS-BEOL metallization structure, including the BS-BEOL metallization structure 202 of the first IC die 104(1), is typically a thinner structure (in the Z-axis, vertical direction in this example) than a FS-BEOL metallization structure, including the FS-BEOL metallization structure 216 of the second IC die 104(2). For example, the thickness of the BS-BEOL metallization structure 202 shown as $D_1$ may be 500 nanometers (nm), whereas the thickness of the S-BEOL metallization structure 216 shown as $D_2$ may be between 1500-2000 nm. This is because a FS-BEOL metallization structure typically includes metal interconnect layers for providing interconnections between semiconductor devices in the same semiconductor layer of its IC die through device contacts that are located on the front side of the semiconductor layer. Thus, more metal interconnect layers may be required in a S-BEOL metallization structure than in a BS-BEOL metallization structure, thus resulting in a thicker FS-BEOL metallization structure. For example, fewer metal interconnect layers may be required in a BS-BEOL metallization structure that may only include electrical routing of a power rail(s) for the semiconductor layer for example, or other connections to the semiconductor layer that do not require access to the front side of the semiconductor layer.

Thus, the electrical routing from the thinner BS-BEOL metallization structure 202 of the first IC die 104(1) in this example, to the FS-BEOL metallization structure 216 of the second IC die 104(2) allows for providing shorter electrical routing paths between the first and second IC dice 104(1), 104(2) for die-to-die interconnections. Providing shorter electrical routing paths for die-to-die interconnections between the IC dice 104(1), 104(2) can provide lower resistance and/or lower capacitance of these die-to-die interconnections for faster and/or compatible performance of semiconductor devices in the IC dice 104(1), 104(2). Another advantage of stacking the BS-BEOL metallization structure 202 of the first IC die 104(1) adjacent to the FS-BEOL metallization structure 216 of the second IC die 104(2) for providing die-to-die interconnections therebetween may be due to fabrication considerations. It may be more feasible to form electrical routing structures (e.g., TSVs) in a thinner metallization structure, such as the BS-BEOL metallization structure 202, than in the thicker metallization structure, such as the FS-BEOL metallization structure 216. For example, it may be easier to form dense TSV structures in BS-BEOL metallization structure 202, because the aspect ratio technology limits to 1:10. So, for example, if the thickness of the BS-BEOL metallization structure was 500 nm, a 50 nm diameter TSV electrical routing structure may be possible. This may allow a greater density of electrical routing structures to be formed in the BS-BEOL metallization structure 202 of the first IC die 104(1) for example, to support a greater density of die interconnections to the IC die 104(1). As technology progresses, a larger number of semiconductor devices are being fabricated in an IC die for a given die area.

With continuing reference to FIG. 2, the IC die 104(2) in the IC die module 102 also includes the BS-BEOL metallization structure 218 on a back side $BS_2$ of the IC die 104(2). In this example, the BS-BEOL metallization structure 218 is disposed adjacent to the back side $BS_2$ of the semiconductor layer 220. The BS-BEOL metallization structure 218 is also formed in a FEOL process for the IC die 104(2). The BS-BEOL metallization structure 218 includes metal interconnect layers 226 that include metal lines for carrying electrical signals (e.g., input/output (I/O) signals, power signals) to semiconductor devices in the semiconductor layer 220 of the IC die 104(2). In this example, the BS-BEOL metallization structure 218 also includes die interconnects 228 that are electrically coupled to active semiconductor devices in the semiconductor layer 220 and to another metallization structure 230 to provide a die interconnection to the IC die 104(2) from the back side $BS_2$ of the IC die 104(2). For example, as shown in FIG. 1, the metallization structure 230 can facilitate another IC die, such as the DRAM module 116, being electrically coupled to the IC die module 102 and to provide electrical interconnections to the IC dice 104(1)-104(3). The metallization structure 230 can be a package substrate, such as an ETS or RDLs, for example. The metallization structure 230 includes one or more metal interconnect layers 232(1)-232(2) that include metal traces configured to route electrical signals. So, to provide a die interconnect between the metallization structure 230 and the IC die 104(2), the metallization structure 230 can be bonded to the IC die module 102 to connect the metal interconnects in the metal interconnect layers 232(1)-232(2) to the die interconnects 228 of the second IC die 104(2).

With continuing reference to FIG. 2, the second IC die 104(2) of the IC die module 102 in FIG. 2 includes a FS-BEOL metallization structure 216 and a BS-BEOL metallization structure 218. The IC die 104(2) also includes semiconductor layer 220 disposed between the FS-BEOL metallization structure 216 and the BS-BEOL metallization structure 218 of the IC die 104(2). The semiconductor layer 220 is where active semiconductor devices are formed in the IC die 104(2). The FS-BEOL metallization structure 216 of the IC die 104(2) is adjacent to and disposed on the IC die 104(1) in this example in a stacked arrangement. For example, the IC die 104(2) can be bonded to the IC die 104(1) with a bond, such as a thermo-compression bond for example. The FS-BEOL metallization structure 216 is a metallization structure located on the front side $FS_2$ of the IC die 104(2), In this example, the FS-BEOL metallization structure 216 is disposed adjacent to the front side $FS_2$ of the semiconductor layer 220. The FS-BEOL metallization structure 216 includes metal interconnect layers 222 that include metal lines for carrying electrical signals (e.g., input/output (I/O) signals, power signals) to semiconductor devices in the semiconductor layer 220 of the IC die 104(2). In this example, the FS-BEM metallization structure 216 includes die interconnects 224 that are electrically coupled to the die interconnects 214 in the BS-BEOL metallization structure 202 of the IC die 104(1) to provide a die-to-die interconnect between the IC die 104(1) and the IC die 104(2).

In this example, the first and second IC dice 104(1) and 104(2) are arranged such that the BS-BEOL metallization structure 202 of the first IC die 104(1) is located adjacent to the FS-BEOL metallization structure 216 of the second IC die 104(2) to provide a FS-BEOL metallization structure 216 to BS-BEOL metallization structure 202 stacking. The electrical routing paths for die-to-die interconnections between the stacked IC dice 104(1), 104(2) are provided from the BS-BEOL metallization structure 202 of the first IC die 104(1) to the FS-BEOL metallization structure 216 of the second IC die 104(2). A BS-BEOL metallization structure, including the BS-BEOL metallization structure 202 of the first IC die 104(1), is typically a thinner structure (in the Z-axis, vertical direction in this example) than a FS-BEOL metallization structure, including the FS-BEOL metallization structure 216 of the second IC die 104(2). For example, the thickness of the BS-BEOL metallization structure 202 shown as $D_1$ may be 500 nm, whereas the thickness of the FS-BEOL metallization structure 216 shown as $D_2$ may be between 1500-2000 nm. This is because a FS-BEOL metallization structure typically includes metal interconnect layers for providing interconnections between semiconductor devices in the same semiconductor layer of its IC die through device contacts that are located on the front side of the semiconductor layer. Thus, more metal interconnect layers may be required in a FS-BEOL metallization structure than in a BS-BEOL metallization structure, thus resulting in a thicker FS-BEOL metallization structure. For example, fewer metal interconnect layers may be required in a BS-BEOL metallization structure that may only include electrical routing of a power rail(s) for the semiconductor layer for example, or other connections to the semiconductor layer that do not require access to the front side of the semiconductor layer.

Thus, the electrical routing from the thinner BS-BEOL metallization structure 202 of the first IC die 104(1) in this example, to the FS-BEOL metallization structure 216 of the second IC die 104(2) allows for providing shorter electrical routing paths between the first and second IC dice 104(1), 104(2) for die-to-die interconnections. Providing shorter electrical routing paths for die-to-die interconnections between the IC dice 104(1), 104(2) can provide lower resistance and/or lower capacitance of these die-to-die interconnections for faster and/or compatible performance of semiconductor devices in the IC dice 104(1), 104(2). Another advantage of stacking the BS-BEOL metallization structure 202 of the first IC die 104(1) adjacent to the FS-BEOL metallization structure 216 of the second IC die 104(2) for providing die-to-die interconnections therebetween may be due to fabrication considerations. For example, it may be more feasible to form electrical routing structures (e.g., TSVs) in a thinner metallization structure, such as the BS-BEOL metallization structure 202, than in the thicker metallization structure, such as the FS-BEOL metallization structure 216, This may allow a greater density of electrical routing structures to be formed in the BS-BEOL metallization structure 202 of the first IC die 104(1) for example, to support a greater density of die interconnections to the IC die 104(1). As technology progresses, a larger number of semiconductor devices are being fabricated in an IC die for a given die area.

With continuing reference to FIG. 2, the IC die 104(2) in the IC die module 102 also includes the BS-BEOL metallization structure 218 on the back side $BS_2$ of the IC die 104(2). In this example, the BS-BEOL metallization structure 218 is disposed adjacent to the back side $BS_2$ of the semiconductor layer 220. The BS-BEOL metallization structure 218 is also formed in a FEOL process for the IC die 104(2). The BS-BEOL metallization structure 218 includes metal interconnect layers 226 that include metal lines for carrying electrical signals (e.g., input/output (I/O) signals, power signals) to semiconductor devices in the semiconductor layer 220 of the IC die 104(2). In this example, the BS-BEOL metallization structure 218 also includes die interconnects 228 that are electrically coupled to active semiconductor devices in the semiconductor layer 204 and to another metallization structure 230 to provide a die interconnection to the IC die 104(2) from the back side $BS_2$ of the IC die 104(2). For example, as shown in FIG. 2, the metallization structure 230 can facilitate another IC die, such as the DRAM module 116, being electrically coupled to the IC die module 102 and to provide electrical interconnections to the IC dice 104(1)-104(3). The metallization structure 230 can be a package substrate, such as an ETS or RDLs, for example. The metallization structure 230 includes one or more metal interconnect layers 232(1)-232(2) that include metal traces configured to route electrical signals. So, to provide a die interconnect between the metallization structure 230 and the IC die 104(2), the metallization structure 230 can be bonded to the IC die module 102 to connect the metal interconnects in the metal interconnect layers 232(1)-232(2) of the metallization structure 230 to die interconnects 228 of the second IC die 104(2).

With continuing reference to FIG. 2, the third IC die 104(3) of the IC die module 102 in FIG. 2 includes a FS-BEOL metallization structure 234 and a BS-BEOL metallization structure 236. The IC die 104(3) also includes a semiconductor layer 238 disposed between the FS-BEOL metallization structure 234 and the BS-BEOL metallization structure 236 of the IC die 104(3). The semiconductor layer 238 is where active semiconductor devices are formed in the IC die 104(3). The FS-BEOL metallization structure 234 of the IC die 104(3) is adjacent to and disposed on the IC die 104(1) in this example in a stacked arrangement. For example, the IC die 104(3) can be bonded to the IC die 104(1) with a bond, such as a thereto-compression bond for example. The FS-BEOL metallization structure 234 is a metallization structure located on the front side $FS_2$ of the IC die 104(3). In this example, the FS-BEOL metallization structure 234 is disposed adjacent to the front side $FS_2$ of the semiconductor layer 238, The FS-BEOL metallization structure 234 includes metal interconnect layers 240 that include metal lines for carrying electrical signals (e.g., input/output (I/O) signals, power signals) to semiconductor devices in the semiconductor layer 238 of the IC die 104(3). In this example, the FS-BEOL metallization structure 234 includes die interconnects 242 that are electrically coupled to the die interconnects 214 in the BS-BEOL metallization structure 202 of the IC die 104(1) to provide a die-to-die interconnect between the IC die 104(1) and the IC die 104(3).

In this example, the first and third IC dice 104(1) and 104(3) are arranged such that the BS-BEOL metallization structure 202 of the first IC die 104(1) is located adjacent to the FS-BEOL metallization structure 234 of the third IC die 104(3) to provide a FS-BEOL metallization structure 234 to BS-BEOL metallization structure 202 stacking. The electrical routing paths for die-to-die interconnections between the stacked IC dice 104(1), 104(3) are provided from the BS-BEOL metallization structure 202 of the IC die 104(1) to the FS-BEOL metallization structure 234 of the third IC die 104(3). A BS-BEOL metallization structure, including the BS-BEOL metallization structure 202 of the first IC die 104(1), is also a thinner structure (in the Z-axis, vertical direction in this example) than the FS-BEOL metallization structure 234 of the third IC die 104(3) in this example. For example, the thickness of the BS-BEOL metallization structure 202 shown as $D_1$ may be 500 nm, whereas the thickness of the FS-BEOL metallization structure 234 also shown as $D_2$ in this example, may be between 1500-2000 nm.

Thus, the electrical routing from the thinner BS-BEOL metallization structure 202 of the first IC die 104(1) in this example, to the FS-BEOL metallization structure 234 of the third IC die 104(3) allows for providing shorter electrical routing paths between the first and third IC dice 104(1), 104(3) for die-to-die interconnections. Providing shorter electrical routing paths for die-to-die interconnections between the IC dice 104(1), 104(3) can provide lower resistance and/or lower capacitance of these die-to-die interconnections for faster and/or compatible performance of semiconductor devices in the IC dice 104(1), 104(3). Another advantage of stacking the BS-BEOL metallization structure 202 of the first IC die 104(1) adjacent to the FS-BEOL metallization structure 234 of the third IC die 104(3) for providing die-to-die interconnections therebetween may be due to fabrication considerations. For example, it may be more feasible to form electrical routing structures (e.g., TSVs) in a thinner metallization structure, such as the BS-BEOL metallization structure 202, than in the thicker metallization structure, such as the FS-BEOL metallization structure 234. This may allow a greater density of electrical routing structures to be formed in the BS-BEOL metallization structure 202 of the first IC die 104(1) for example, to support a greater density of die interconnections to the IC die 104(1). As technology progresses, a larger number of semiconductor devices are being fabricated in an IC die for a given die area.

With continuing reference to FIG. 2, the IC die 104(3) in the IC die module 102 also includes the BS-BEOL metallization structure 236 on the back side $BS_2$ of the IC die 104(3). In this example, the BS-BEOL metallization structure 236 is disposed adjacent to the back side $BS_2$ of the semiconductor layer 238. The BS-BEOL metallization structure 236 is also formed in a FEOL process for the IC die 104(3). The BS-BEOL metallization structure 236 includes metal interconnect layers 244 that include metal lines for carrying electrical signals (e.g., input/output (I/O) signals, power signals) to semiconductor devices in the semiconductor layer 238 of the IC die 104(3). In this example, the BS-BEOL metallization structure 236 also includes die interconnects 246 that are electrically coupled to active semiconductor devices in the semiconductor layer 238 and the metallization structure 230 to provide a die interconnection to the IC die 104(3) from the back side $BS_2$ of the IC die 104(3). So, to provide a die interconnect between the metallization structure 230 and the IC die 104(3), the metallization structure 230 can be bonded to the IC die module 102 to connect the metal interconnects in the metal interconnect layers 232(1)-232(2) of the metallization structure 230 to the die interconnects 246 of the third IC die 104(3).

Also note that die-to-die interconnection between the IC dice 104(1)-104(3) in the IC package 100 can also be provided through the package substrate 106 and/or the metallization structure 230. These die-to-die interconnections can be provided through an interconnection other than between a FS-BEOL metallization structure 216, 234 of the second and/or third IC dice 104(2), 204(3) to the BS-BEOL metallization structure 202 of the first IC die 104(1). For example, as shown in the IC package 100 in FIG. 1, vias 112 can be provided in the IC die module 102 adjacent to the IC dice 104(1)-104(3). The vias 112 can be interconnected to a metal line in a metal interconnect layer 232(1), 108(1) of the metallization structure 230 and/or the package substrate 106. In this manner, electrical signal routing can be provided between the metallization structure 230 and/or the package substrate 106. Electrical routing provided between the metallization structure 230 and/or the package substrate 106 allows a die-to-die interconnection between the first IC die 104(1) and a second and/or third IC die 104(2), 104(3) to be provided through the FS-BEOL metallization structure 200 of the first IC die 104(1) through a BS-BEOL metallization structure 218, 236 of the second and/or third IC die 104(2), 104(3). This electrical routing to the first IC die 104(1) would be routed through the package substrate 106 to the metal interconnect layer 108(1) and to a die interconnect 208 of the first IC die 104(1). As shown in FIG. 2, this electrical routing to the second and/or third IC die 104(2), 104(3) would be routed through the metallization structure 230 to the metal interconnect layer 232(1) and to a die interconnect 228, 246 of the second and/or third IC die 104(2), 104(3).

Note that terms "top" and "bottom" are relative terms to the metallization structures in FIG. 2 as being oriented in the Z-axis or vertical direction. But also note that the IC package 100 could also be oriented where it is rotated 180 degrees from as shown in FIG. 2 where a metallization structure indicated as above or on top of another metallization structure would be below the other metallization structure, Thus, the terms "top" and "bottom" are relative terms and not meant to imply a strict limitation about the orientation of one metallization structure to another metallization structure.

Figure 4:
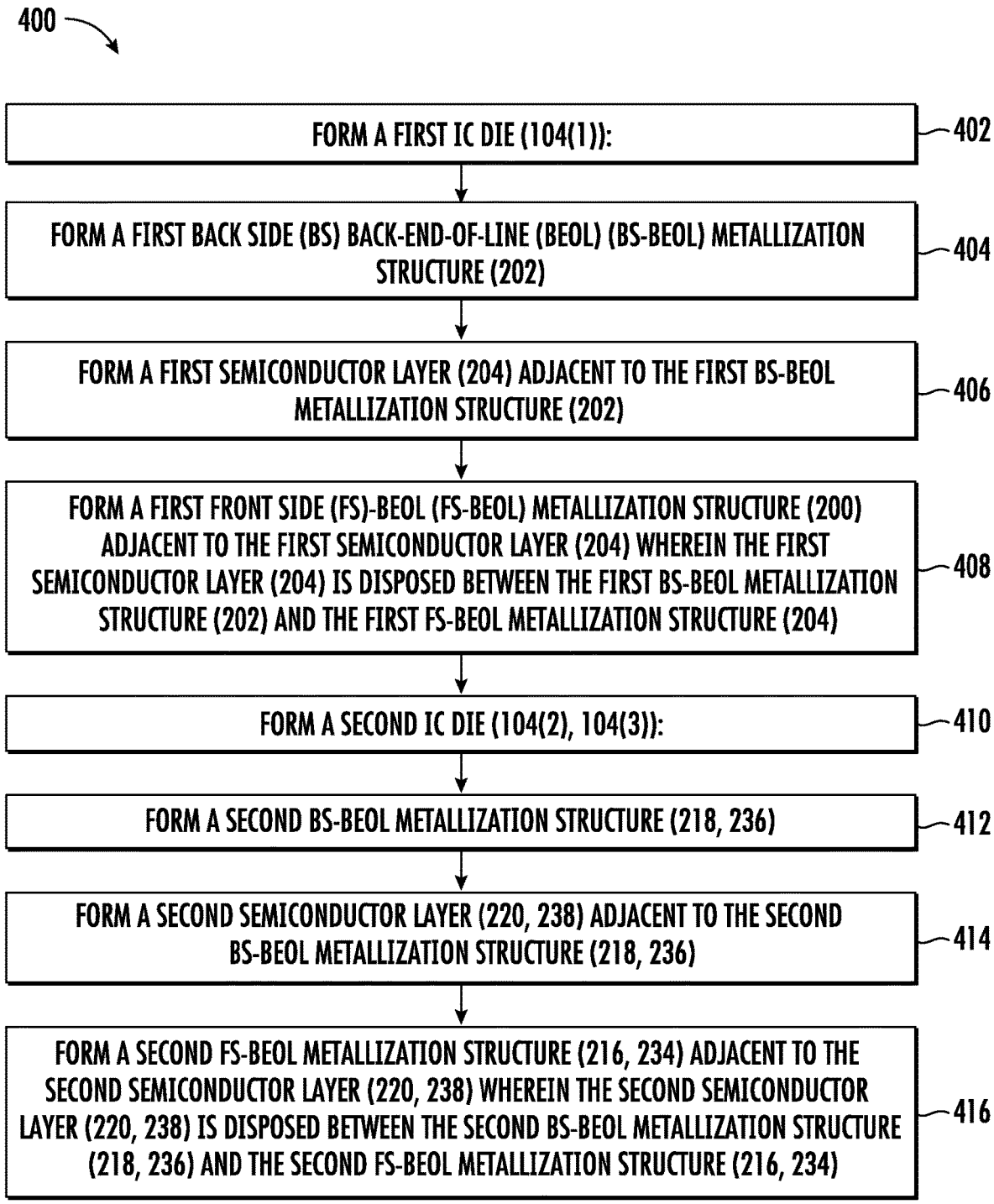
FIG. 4 is a flowchart illustrating an exemplary process of fabricating an IC package employing an IC die module employing FS-BEOL metallization structure to BS-BEOL metallization structure stacking to provide 3D die stacking, including, but not limited to, the IC packages in FIGS. 1 and 2.

FIG. 4 is a flowchart illustrating an exemplary process 400 of fabricating an IC package employing an IC die module employing FS-BEOL metallization structure to BS-BEOL metallization structure stacking to provide 3D die stacking, including, but not limited to, the IC package 100 in FIGS. 1 and 2. The process 400 in FIG. 4 will be described with reference to the exemplary IC package 100 in FIGS. 1 and 2.

In this regard, the process 400 includes forming the first IC die 104(1) (block 402 in FIG. 4). The first IC die 104(1) is formed by forming the first BS-BEOL metallization structure 202 (block 404 in FIG. 4). The first IC die 104(1) is also formed by forming a first semiconductor layer 204 adjacent to the first BS-BEOL metallization structure 202 (block 406 in FIG. 4), The first IC die 104(1) is also formed by forming the FS-BEOL metallization structure 200 adjacent to the first semiconductor layer 204, wherein the first semiconductor layer 204 is disposed between the first BS-BEOL metallization structure 202 and the first FS-BEOL metallization structure 200 (block 408 in FIG. 4), The process 400 also includes forming a second IC die 104(2), 104(3) (block 410 in FIG. 4). The second IC die 104(2), 104(3) is formed by forming the second BS-BEOL metallization structure 218, 236 (block 412 in FIG. 4). The second IC die 104(2), 104(3) is also formed by forming a second semiconductor layer 220, 238 adjacent to the second BS-BEOL metallization structure 218, 236 (block 414 in FIG. 4). The second IC die 104(2), 104(3) is also formed by forming the second FS-BEOL metallization structure 216, 234 adjacent to the second semiconductor layer 220, 238, wherein the second semiconductor layer 220, 238 is disposed between the second BS-BEOL metallization structure 218, 236 and the second FS-BEOL metallization structure 216, 234 (block 416 in FIG. 4).

FIGS. 5A-5C are a flowchart that illustrates an exemplary fabrication process 500 for fabricating an IC die that supports FS-BEOL metallization structure to BS-BEOL metallization structure stacking. FIGS. 6A-6F illustrate exemplary fabrication stages of the IC die according to the fabrication process 500 in FIGS. 5A-5C. The fabrication process 500 to fabricate the IC die in FIGS. 5A-5C may be used to fabricate any of the IC dice 104(1)-104(3) in the IC package 100 in FIGS. 1 and 2 for example. The fabrication process 500 in FIGS. 5A-5C will be described below in conjunction with fabrication stages in FIGS. 6A-6F using the IC die 104(1) in the IC package 100 as an example.

As shown in the exemplary fabrication stage 600A in FIG. 6A, the process 500 includes forming the first BS-BEOL metallization structure 202 on a substrate 602 such that a first surface 604 of the first BS-BEOL metallization structure 202 is disposed adjacent to a first surface 606 of the substrate (block 502 in FIG. 5A). The first BS-BEOL metallization structure 202 may be formed as RDL layers in a RDL process as an example. The substrate 602 provides a support structure for forming the first BS-BEOL metallization structure 202 and/or insulation as a dielectric layer. The substrate 602 has a height $H_1$ in the Z-axis direction as shown in FIG. 5A. The substrate 602 may be a dielectric material for example. As shown in the exemplary fabrication stage 600B in FIG. 6B, a next step in the process 500 is to form a carrier wafer 608 on a second surface 610 of the first BS-BEL metallization structure 202 opposite the first surface 604 of the first BS-BEOL metallization structure 202 (block 504 in FIG. 5A). The carrier wafer 608 is used to provide a handle for the first BS-BEOL metallization structure 202 and substrate 602 for further processing. As shown in the exemplary fabrication stage 600C in FIG. 6C, a next step in the process 500 is to thin down the substrate 602 (block 506 in FIG. 5A). In the exemplary fabrication stage 600C in FIG. 6C, the height of the substrate 602 is thinned down to height $H_2$ in the Z-axis direction which is a reduced height from the height $H_1$ of the substrate 602 in the fabrication stages 600A and 600B in FIGS. 6A and 6B.

As shown in the exemplary fabrication stage 600D in FIG. 6D, a next step in the process 500 is to form the first semiconductor layer 204 on a second surface 612 of the thinned down substrate 602 opposite the first surface 606 of the substrate 602 (block 508 in FIG. 5B). Active semiconductor devices can then be formed in the first semiconductor layer 204, such as FETs for example. Contacts are also formed in contact with the active semiconductor devices formed in the first semiconductor layer 204. The first FS-BEOL metallization structure 200 is also formed adjacent to and on the first semiconductor layer 204 to form the first IC die 104(1). As previously discussed, the first FS-BEOL metallization structure 200 provides electrical signal routing between the metal lines in the first FS-BEOL metallization structure 200 and the active semiconductor devices formed in the first semiconductor layer 204. As shown in the exemplary fabrication stage 600E in FIG. 6E, a next step in the process 500 can be to form conductive bumps 110, such as solder bumps, in contact with die interconnects of the first FS-BEOL metallization structure 200 as shown in FIG. 6E (block 510 in FIG. 5). Alternatively, a package substrate, such as the package substrate 106 in FIGS. 1 and 2, could be formed on the first FS-BEOL metallization structure 200 to provide additional support and electrical signal routing.

As shown in the exemplary fabrication stage 600E in FIG. 6F, a next step in the process 500 is to remove the carrier wafer 608 from the second surface 610 of the first BS-BEOL metallization structure 202 and stack a second FS-BEOL metallization structure 216, 234 of a second IC die 104(2), 104(3) on the first BS-BEOL metallization structure 202 of the first IC die 104(1) (block 512 in FIG. 5C). The second IC die 104(2), 104(3) can be made by the same fabrication process as was used to fabricate the first IC die 104(1) described above with regard to FIGS. 5A-5B and the fabrication stages 600A-600E in FIGS. 6A-6E.

As shown in the IC package 100 in FIGS. 1 and 2, the FS-BEOL metallization structures 216, 234 of the second and third IC dice 104(2), 104(3) are mounted directly to the BS-BEOL metallization structure 202 of the first IC die 104(1). This requires that the die interconnect 224, 242 of the FS-BEOL metallization structures 216, 234 of the second and third IC dice 104(2), 104(3) be aligned with the die interconnects 214 of the BS-BEOL metallization structure 202 of the first IC die 104(1). This may be difficult to accomplish in a fabrication process and/or without risking mis-alignment in the die interconnects 214, 224, 242, which could increase the resistance of die-to-die interconnections made through the FS-BEOL metallization structures 216, 234 and the BS-BEOL metallization structure 202. It may be more desired to provide more flexibility in providing interconnections between the die interconnects 214, 224, 242 of the FS-BEOL metallization structures 216, 234 and the BS-BEOL metallization structure 202.

Figure 7:
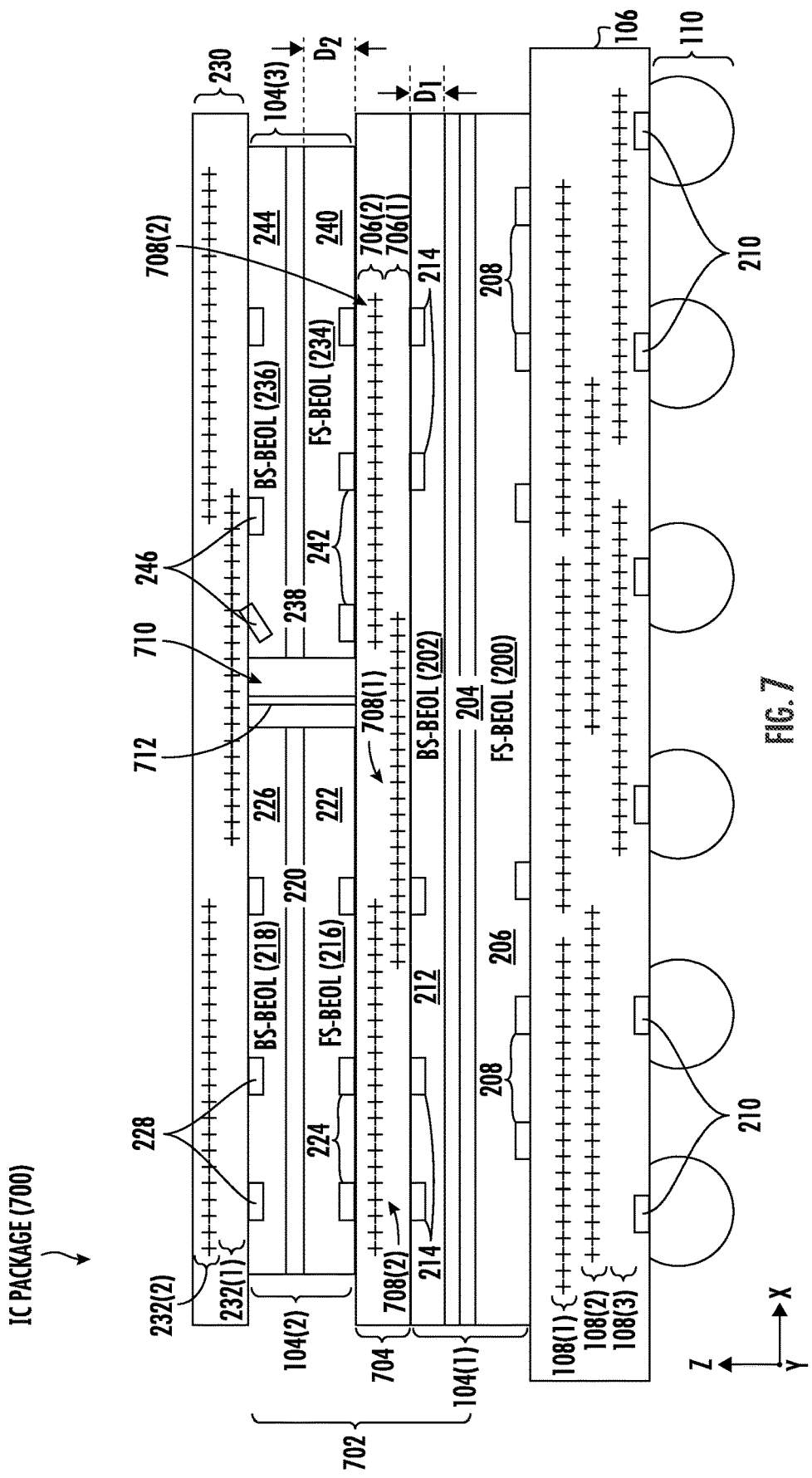
FIG. 7 is a side view of another exemplary IC package employing an IC die module employing FS-BEOL metallization structure to BS-BEOL metallization structure stacking to provide 3D die stacking, wherein the IC die module also includes an intermediate metallization layer disposed between the FS-BEOL and BS-BEOL metallization structures to facilitate die-to-die interconnections.

In this regard, FIG. 7 is a side view of another exemplary IC package 700 employing an IC die module 702 employing the IC dice 104(1)-104(3) in the IC package 100 in FIGS. 1 and 2. Common components between the IC package 700 in FIG. 7 and the IC package 100 in FIGS. 1 and 2 are shown with common element numbers between FIGS. 1 and 2 and FIG. 7, and are not re-described. However, as shown in FIG. 7, the package 700 includes an intermediate metallization structure 704 disposed between the BS-BEOL metallization structure 202 of the first IC die 104(1) and the FS-BEOL metallization structures 216, 234 of the second and third IC dice 104(2), 104(3) to facilitate more flexible die-to-die interconnections between the first IC die 104(1) and the second and third IC dice 104(2), 104(3). The intermediate metallization structure 704 may be formed from RDLs, as an example.

With reference to FIG. 7, the intermediate metallization structure 704 comprises one or more intermediate metal interconnect layers 706(1), 706(2) that each include one or more intermediate interconnects 708(1), 708(2). At least one of the first die interconnects 214 of the first BS-BEOL metallization structure 202 of the first IC die 104(1) is coupled to at least one of the intermediate interconnects 708(1) of the bottom intermediate metal interconnect layer 706(1). Further, at least one of the second and/or third die interconnects 224, 236 of the second and/or third FS-BEOL metallization structures 216, 234 of the second and/or third IC dice 104(2), 104(3) is coupled to at least one of the intermediate interconnects 708(2) of the top intermediate metal interconnect layer 706(2). The intermediate metal interconnect layers 706(1), 706(2) provide electrical connections and routing between them to provide the desired electrical signal routing between the first BS-BEOL metallization structure 202 of the first IC die 104(1) to the second and/or third FS-BEOL metallization structures 216, 234 of the second and/or third IC dice 104(2), 104(3) to provide the desired die-to-die interconnections.

Figure 8:
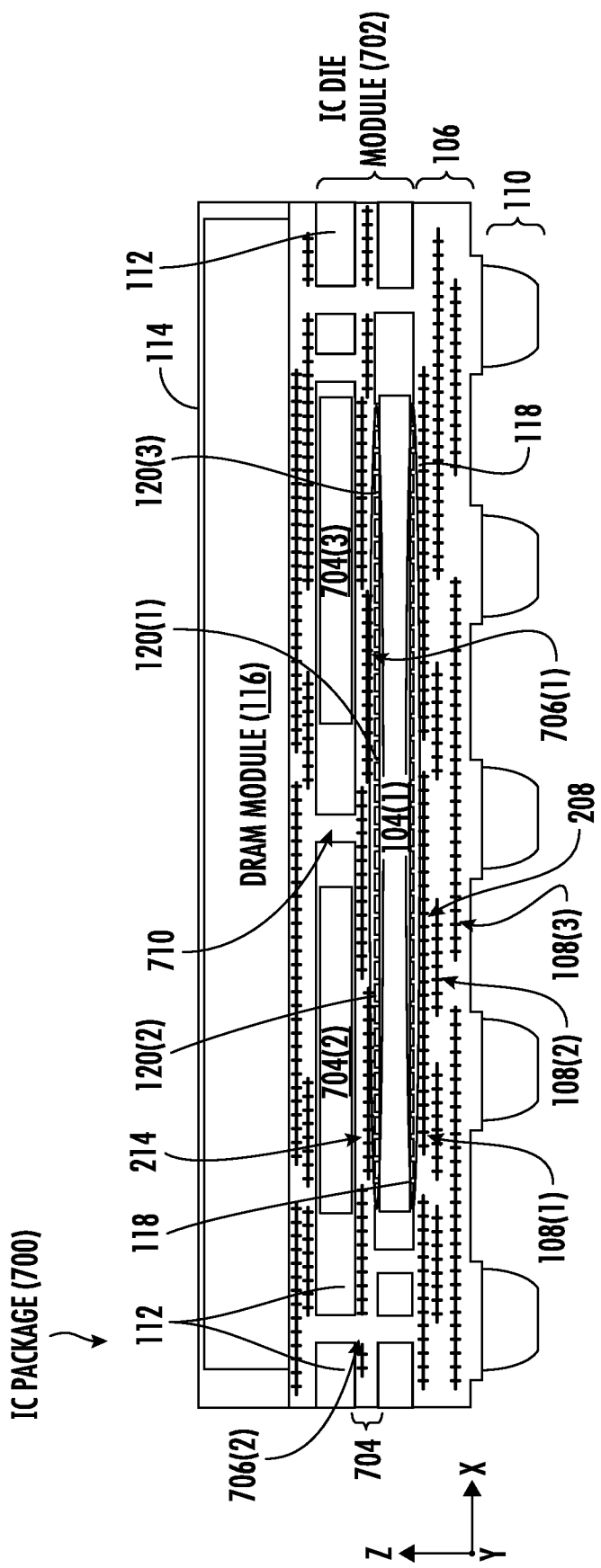
FIG. 8 is a side view of another exemplary IC package employing an IC die module employing FS-BEOL metallization structure to BS-BEOL metallization structure stacking to provide 3D die stacking, wherein the IC die module also includes an intermediate metallization layer disposed between the FS-BEOL and BS-BEOL metallization structures to facilitate die-to-die interconnections and white space interconnections between adjacent IC dies.

As also shown in FIG. 7, a void space 710 available for electrical routing structures is provided between the adjacent IC dice 104(2), 104(3) in the X-axis direction in the IC package 700 as a result of bonding the IC dice 104(2), 104(3) to the IC die 104(1). With the intermediate metallization structure 704 provided, this allows additional electrical routing paths to be formed between the IC dice 104(2), 104(3) down to the intermediate metallization structure 704 for additional electrical signal routing capability. For example, one or more vias 712 could be formed in the void space 710 that are coupled between the additional metallization structure 230 and the intermediate metallization structure 704 to provide additional electrical signal routing to the first IC die 104(1). This electrical signal routing from the intermediate metallization structure 704 could then be routed to one or both of the other IC dice 104(2), 104(2) through the additional metallization structure 230. The electrical signal routing from the intermediate metallization structure 704 through the additional metallization structure 230 could also be routed to the package substrate 106 through vias 112 as shown in FIG. 8.

Thus, with the IC package 700 in FIG. 7, at least three (3) electrical signal routing paths are provided for die interconnection. One electrical signal routing paths is for die-to-die interconnections between the BS-BEOL metallization structure 202 of the IC die 104(1) and the FS-BEOL metallization structures 216, 234 of the IC dice 104(2), 104(3) through the intermediate metallization structure 704. Another electrical signal routing path is between the intermediate metallization structure 704 and the additional metallization structure 230, which could then provide routing through the BS-BEOL metallization structures 218, 236 of the second and third dice 104(2), 104(3), Another electrical signal routing path is between the additional metallization structure 230 and the package substrate 106, which can provide electrical signal routing from the BS-BEOL metallization structures 218, 236 of the second and third IC dice 104(2), 104(3) through the additional metallization structure 230 and package substrate 106 to the FS-BEOL metallization structure 200 of the first IC die 104(1). Also note that if an additional IC die is mounted to the additional metallization structure 230, such as the DRAM module 116 as shown in FIG. 8, electrical signal routing can be provided from the intermediate metallization structure 704 through the void space 710 and through the additional metallization structure 230 to the additional IC die.

FIGS. 9A-9E are a flowchart illustrating exemplary process 900 of fabricating an IC package employing an IC die module employing FS-BEOL metallization structure to BS-BEOL metallization structure stacking to provide 3D die stacking, wherein the IC die module also includes an intermediate metallization layer disposed between the FS-BEOL and BS-BEOL metallization structures to facilitate die-to-die interconnections. For example, the process 900 in FIGS. 9A-9E could be used to fabricate the IC package 700 in FIGS. 7 and 8. FIGS. 10A-10M illustrate exemplary fabrication stages during fabrication of an package according to the process 900 in FIGS. 9A-9E. The process 900 in FIG. 9A-9E will be discussed below in conjunction with the fabrication stages in FIGS. 10A-10M and referring to components of the IC package 700 in FIGS. 7 and 8 as an example.

In this regard, as shown in the exemplary fabrication stage 1000A in FIG. 10A, a step in the fabrication process 900 to form an IC package employing FS-BEOL metallization structure to BS-BEOL metallization structure stacking to provide 3D die stacking, is to singulate fabricated dies, like the first IC die 104(1) shown. The first IC die 104(1) is attached to a carrier water 1002 to support the first IC die 104(1) in further fabrication steps (block 902 in FIG. 9A). Vias 112(1) are also formed to form electrical routing paths as desired that are not directly die-to-die interconnections (block 902 in FIG. 9A). As shown in the exemplary fabrication stage 1000B in FIG. 10B, another step in the fabrication process 900 is to apply a mold compound 1004 over the IC die 104(1) mounted on the carrier wafer 1002 and surrounding the vias 112(1) to isolate the IC die 104(1) and vias 112(1) (block 904 in FIG. 9A). As shown in the exemplary fabrication stage 1000C in FIG. 10C, another step in the fabrication process 900 is to remove the carrier wafer 1002 (block 906 in FIG. 9A). Steps 902-906 prepare the first IC die 104(1) for stacking with other IC dies in later fabrication steps, now discussed.

As shown in the exemplary fabrication stage 1000D in FIG. 10D, another step in the fabrication process 900 to prepare the second and third IC dice 104(2), 104(3). The second and third IC dice 104(2), 104(3) are attached to a carrier wafer 1006 to support the second and third dice 104(2), 104(3) in further fabrication steps (block 908 in FIG. 9B). Vias 112(2) are also formed to form electrical routing paths as desired that are not directly die-to-die interconnections (block 908 in FIG. 9A), As shown in the exemplary fabrication stage 11000E in FIG. 10E, another step in the fabrication process 900 is apply a mold compound 1008 over the IC dice 104(2), 104(3) mounted on the carrier wafer 1006 and surrounding the vias 112(1) to isolate the IC dice 104(2), 104(3) and vias 112(2) (block 910 in FIG. 9B).

As shown in the exemplary fabrication stage 1000F in FIG. 10F, another step in the fabrication process 900 is to remove (e.g., grind down) the mold compound 1008 to reveal top surfaces 1010(2) of the vias 112(2) (block 912 in FIG. 9C). The vias 112(2) are also ground down to provide the top surfaces 1010(2) (block 912 in FIG. 9C). This is so that the vias 112(2) can be connected to the vias 112(1) formed with the first IC die 104(1) in FIG. 10C when the IC dice 104(1)-104(3) are stacked in a later fabrication step to form the IC package 700. As shown in the exemplary fabrication stage 1000E in FIG. 10G, another step in the fabrication process 900 is form the intermediate metallization structure 704 on the FS-BEOL metallization structures 216, 234 of the IC dice 104(2), 104(3) (block 914 in FIG. 9C). In this example, the intermediate metallization structure 704 is formed such that intermediate interconnects 708(2) of the intermediate metal interconnect layer 706(2) are formed in contact with the die interconnects 224, 242 of the IC dice 104(2), 104(3) as discussed above. The intermediate metallization structure 704 may be formed as RDLs as an example.

As shown in the exemplary fabrication stage 1000H in FIG. 10H, another step in the fabrication process 900 is to bond the BS-BEOL metallization structure 202 of the IC die 104(1) to the intermediate metallization structure 704 as part of the IC package 700 (block 916 in FIG. 9D). The die interconnects 214 of the IC die 104(1) are placed in contact with intermediate interconnects 708(1) of the intermediate metal interconnect layer 706(1) of the intermediate metallization structure 704 as discussed above. The IC die 104(1) may be bonded to the intermediate metallization structure 704 using a thermo-compression bonding to form a thermo-compression bond between the two. The vias 112(1), 112(2) are also bonded together as a result of bonding the IC die 104(1) to the intermediate metallization structure 704. As shown in the exemplary fabrication stage 1000I in FIG. 10I, another step in the fabrication process 900 is to remove (e.g., grind down) the mold compound 1004 to reveal top surfaces 1010(1) of the vias 112(1) (block 918 in FIG. 9D). As shown in the exemplary fabrication stage 1000J in FIG. 10J, another step in the fabrication process 900 is to form the package substrate 106 on the FS-BEOL metallization structure 200 of the IC die 104(1) (block 920 in FIG. 9D). The package substrate 106 may be formed as RDLs for example.

As shown in the exemplary fabrication stage 1000K in FIG. 10K, another step in the fabrication process 900 is form and attach the conductive bumps 110 to the substrate interconnects 210 of the package substrate 106 (block 922 in FIG. 9E). As shown in the exemplary fabrication stage 1000L in FIG. 10L, another step in the fabrication process 900 is to debond the carrier wafer 1006 from the IC package 700 (block 924 in FIG. 9E). As shown in the exemplary fabrication stage 1000M in FIG. 10M, another step in the fabrication process 900 is to bond the additional IC die 230/DRAM module 116 to the IC package 700 and couple it to the vias 112(2) to form conductive connections to the package substrate 106 (block 926 in FIG. 9E).

Note that terms "top" and "bottom" are relative terms as being oriented in the Z-axis or vertical direction, But also note that any of the disclosed IC packages here could also be oriented where it is rotated 180 degrees from as shown where their metallization structures indicated as above or on top of another metallization structure would be below the other metallization structure. Thus, the terms "top" and "bottom" are relative terms and are not meant to imply a strict limitation about the orientation of one metallization structure to another metallization structure.

IC packages employing an IC die module employing FS-BEOL metallization structure to BS-BEOL metallization structure stacking to provide 3D die stacking, including, but not limited to, the IC packages in FIGS. 1, 2, 7, and 8, and according to the fabrication processes in FIGS. 5A-6F and 9A-10M, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
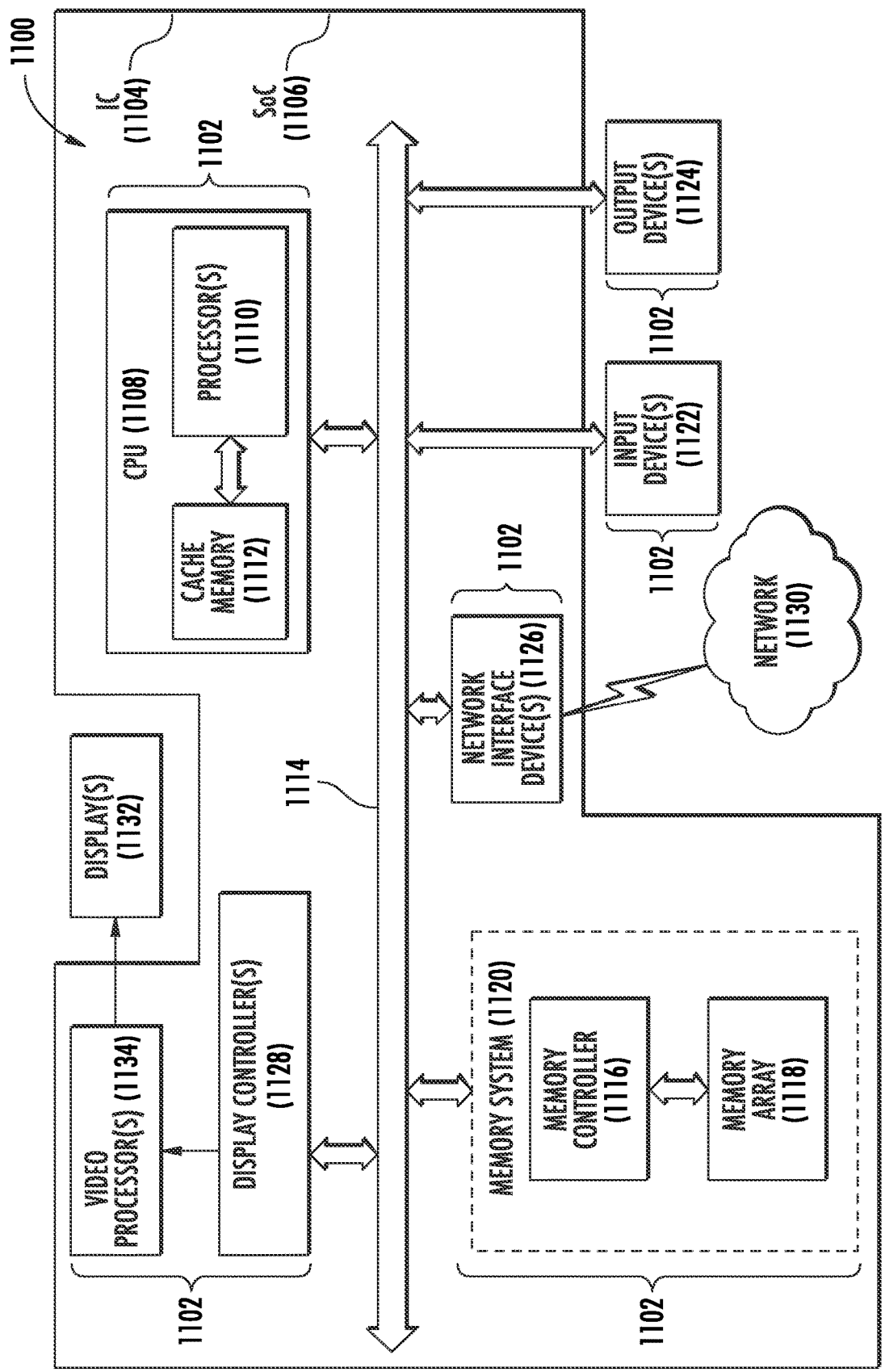
FIG. 11 is a block diagram of an exemplary processor-based system that can be provided in one or more IC packages employing an IC die module employing FS-BEOL metallization structure to BS-BEOL metallization structure stacking to provide 3D die stacking, including, but not limited to, the IC packages in FIGS. 1, 2, 7, and 8, and according to the fabrication processes in FIGS. 5A-6F and 9A-10M.

In this regard, FIG. 11 illustrates an example of a processor-based system 1100 including a circuit that can be provided in an IC package 1102 employing an IC die module employing FS-BEOL metallization structure to BS-BEOL metallization structure stacking to provide 3D die stacking, including, but not limited to, the IC packages in FIGS. 1, 2, 7, and 8, and according to the fabrication processes in FIGS.

5A-6F and 9A-10M, and according to any aspects disclosed herein. In this example, the processor-based system 1100 may be formed as an IC 1104 in an IC package 1102 and as a system-on-a-chip (SoC) 1106. The processor-based system 1100 includes a CPU 1108 that includes one or more processors 1110, which may also be referred to as CPU cores or processor cores. The CPU 1108 may have cache memory 1112 coupled to the CPU 1108 for rapid access to temporarily stored data. The CPU 1108 is coupled to a system bus 1114 and can intercouple master and slave devices included in the processor-based system 1100. As is well known, the CPU 1108 communicates with these other devices by exchanging address, control, and data information over the system bus 1114. For example, the CPU 1108 can communicate bus transaction requests to a memory controller 1116 as an example of a slave device. Although not illustrated in FIG. 11, multiple system buses 1114 could be provided, wherein each system bus 1114 constitutes a different fabric.

Other master and slave devices can be connected to the system bus 1114. As illustrated in FIG. 11, these devices can include a memory system 1120 that includes the memory controller 1116 and a memory array(s) 1118, one or more input devices 1122, one or more output devices 1124, one or more network interface devices 1126, and one or more display controllers 1128, as examples. Each of the memory system 1120, the one or more input devices 1122, the one or more output devices 1124, the one or more network interface devices 1126, and the one or more display controllers 1128 can be provided in the same or different IC packages 1102. The input device(s) 1122 can include any type of input device, including, but not limited to, input keys, switches, voice processors, etc. The output device(s) 1124 can include any type of output device, including, but not limited to, audio, video, other visual indicators, etc. The network interface device(s) 1126 can be any device configured to allow exchange of data to and from a network 1130. The network 1130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1126 can be configured to support any type of communications protocol desired.

The CPU 1108 may also be configured to access the display controller(s) 1128 over the system bus 1114 to control information sent to one or more displays 1132. The display controller(s) 1128 sends information to the display(s) 1132 to be displayed via one or more video processors 1134, which process the information to be displayed into a format suitable for the display(s) 1132. The display controller(s) 1128 and video processor(s) 1134 can be included as ICs in the same or different IC packages 1102, and in the same or different IC package 1102 containing the CPU 1108 as an example. The display(s) 1132 can include any type of display, including, but not limited to, a cathode ray tube (CRT), a liquid crystal display (LCD), a plasma display, a light emitting diode (LED) display, etc.

Figure 12:
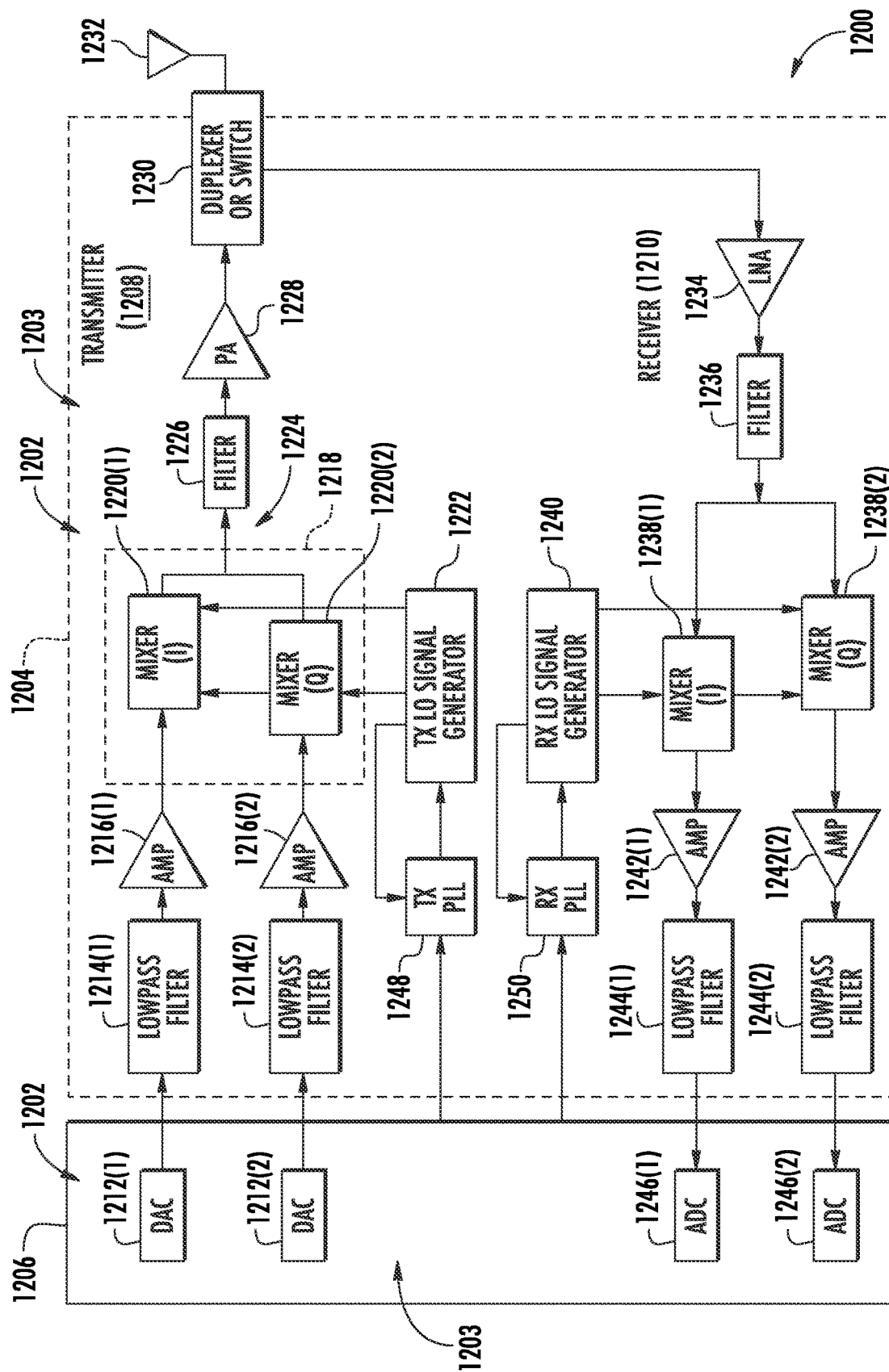
FIG. 12 is a block diagram of an exemplary wireless communications device that includes radio frequency (RF) components provided in one or more IC packages employing an IC die module employing FS-BEOL metallization structure to BS-BIOL metallization structure stacking to provide 3D die stacking, including, but not limited to, the IC packages in FIGS. 1, 2, 7, and 8, and according to the fabrication processes in FIGS. 5A-6F and 9A-10M.

FIG. 12 illustrates an exemplary wireless communications device 1200 that includes radio frequency (RF) components formed from one or more ICs 1202, wherein any of the ICs 1202 can be included in an IC package 1203 employing an IC die module employing FS-BEOL metallization structure to BS-BEOL metallization structure stacking to provide 3D die stacking, including, but not limited to, the IC packages in FIGS. 1, 2, 7, and 8, and according to the fabrication processes in FIGS. 5A-6F and 9A-10M, and according to any aspects disclosed herein. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RE signal is routed through a duplexer or switch 1230 and transmitted via an antenna 1232.

In the receive path, the antenna 1232 receives signals transmitted by base stations and provides a received RE signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RE signal is amplified by the INA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects:

1. An integrated circuit (IC) package, comprising:
   a first IC die comprising:
      a first front side (FS)-back-end-of-line (BEOL) (FS-BEOL) metallization structure;
      a first back side (BS)-BEOL (BS-BEOL) metallization structure; and
      a first semiconductor layer disposed between the first FS-BEOL metallization structure and the first BS-BEOL metallization structure; and
   a second IC die, comprising:
      a second FS-BEOL metallization structure adjacent to the first BS-BEOL metallization structure;
      a second BS-BEOL metallization structure; and
      a second semiconductor layer disposed between the second FS-BEM metallization structure and the second BS-BEOL metallization structure.

2. The IC package of aspect 1 further comprising an IC package;
   the first FS-BEOL metallization structure of the first IC die adjacent to a package substrate.

3. The IC package of any one of aspects 1 and 2, wherein the second IC die is disposed above the first IC die in a vertical direction.

4. The IC package of any one of aspects 1 to 3, wherein:
   the first BS-BEOL metallization structure of the first IC die comprises a first metal interconnect layer comprising one or more first die interconnects electrically coupled to the first semiconductor layer;
   the second FS-BEOL metallization structure of the second IC die comprises a second metal interconnect layer comprising one or more second die interconnects electrically coupled to the second semiconductor layer; and
at least one of one or more first die interconnects coupled to at least one of the one or more second die interconnects.

5. The IC package of aspect 4, wherein the first FS-BEOL metallization structure of the first IC die comprises a third metal interconnect layer comprising one or more third die interconnects electrically coupled to the first semiconductor layer.

6. The IC package of any one of aspects 4 to 5, further comprising:
a package substrate comprising one or more substrate interconnects; the first FS-BEOL metallization structure of the first IC die adjacent to the package substrate;
at least one substrate interconnect among the one or more substrate interconnects electrically coupled to at least one first die interconnect among the one or more first die interconnects; and
further comprising one or more conductive bumps electrically coupled to the one or more substrate interconnects.

7. The IC package of any one of aspects 1 to 6, wherein the first FS-BEOL metallization structure of the first IC die comprises a third metal interconnect layer comprising one or more third die interconnects electrically coupled to the first semiconductor layer.

8. The IC package of aspect 4, wherein:
the first BS-BEOL metallization structure of the first IC die further comprises one or more first vertical interconnect accesses (vias) electrically coupled to the one or more first die interconnects and the first semiconductor layer; and
the second FS-BEOL metallization structure of the second IC die further comprises one or more second vias electrically coupled to the one or more second die interconnects and the second semiconductor layer.

9. The IC package of any one of aspects 1 to 8, further comprising an intermediate metallization structure disposed between the first BS-BEOL metallization structure of the first IC die and the second FS-BEOL metallization structure of the second IC die.

10. The IC package of aspect 9, wherein:
the first BS-BEOL metallization structure of the first die comprises a first metal interconnect layer comprising one or more first die interconnects electrically coupled to the first semiconductor layer;
the second FS-BEOL metallization structure of the second IC die comprises a second metal interconnect layer comprising one or more second die interconnects electrically coupled to the second semiconductor layer;
the intermediate metallization structure comprises at least one intermediate metal interconnect layer comprising one or more intermediate interconnects;
at least one of the one or more first die interconnects is coupled to at least one of the one or more intermediate interconnects; and
at least one of the one or more second die interconnects is coupled to at least one of the one or more intermediate interconnects to electrically couple the at least one of the one or more first die interconnects to the at least one of the one or more second die interconnects.

11. The IC package of aspect 10, wherein the first FS-BEOL metallization structure of the first IC die comprises a third metal interconnect layer comprising one or more third die interconnects electrically coupled to the first semiconductor layer.

12. The IC package of any one of aspects 9 to 11, further comprising:
a third IC die, comprising:
a third FS-BEOL metallization structure adjacent to the first BS-BEOL metallization structure;
a third BS-BEOL metallization structure; and
a third semiconductor layer disposed between the third FS-BEOL metallization structure and the third BS-BEOL metallization structure;
the third IC die disposed adjacent in a lateral direction to the second IC die and separated from the second IC die by a gap distance to form a void region between the second IC die and the third IC die; and
the intermediate metallization structure comprises at least one intermediate metallization layer comprising one or more intermediate interconnects.

13. The IC package of aspect 12, further comprising a via disposed in the void region and electrically coupled to at least one of the one or more intermediate interconnects in the intermediate metallization structure.

14. The IC package of aspect 13, further comprising a fourth IC die comprising a fourth semiconductor layer, the fourth IC die disposed adjacent to the second IC die;
the via electrically coupled to the fourth semiconductor layer.

15. The IC package of any one of aspects 12 to 13, wherein:
the first BS-BEOL metallization structure of the first IC die comprises a first metal interconnect layer comprising one or more first die interconnects electrically coupled to the first semiconductor layer; and
at least one of the one or more first die interconnects is coupled to at least one of the one or more of the intermediate interconnects.

16. The IC package of any one of aspects 10 to 11, wherein the intermediate metallization structure comprises one or more redistribution layers (RDLs).

17. The package of any one of aspects 1 to 16 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A method of fabricating an integrated circuit (IC) package, comprising:
forming a first IC die, comprising:
forming a first back side (BS) back-end-of-line (BEOL) (BS-BEOL) metallization structure;
forming a first semiconductor layer adjacent to the first BS-BEOL metallization structure; and
forming a first front side (FS)-BEL (FS-BEOL) metallization structure adjacent to the first semiconductor layer wherein the first semiconductor layer is disposed between the first BS-BEOL metallization structure and the first FS-BEOL metallization structure; and forming a second IC die, comprising:
  forming a second BS-BEOL metallization structure;
  forming a second semiconductor layer adjacent to the second BS-BEOL metallization structure; and
  forming a second FS-BEOL metallization structure adjacent to the second semiconductor layer wherein the second semiconductor layer is disposed between the second BS-BEOL metallization structure and the second FS-BEOL metallization structure.

19. The method of aspect 18, further comprising bonding the second IC die to the first IC die.

20. The method of aspect 19, further comprising:
  forming an intermediate metallization structure adjacent to the second FS-BEOL metallization structure of the second IC die; and
  coupling at least one intermediate interconnect among one or more intermediate interconnects in an intermediate metal interconnect layer of the intermediate metallization structure to at least one first die interconnect among one or more first die interconnects of the first FS-BEOL metallization structure of the first IC die.

21. The method of aspect 20, further comprising:
  coupling at least one via to the at least one intermediate interconnect among the one or more intermediate interconnects; and
  removing a mold compound on the first IC die to expose a top surface of the at least one via.

22. The method of any one of aspects 20 to 21, further comprising:
  forming a package substrate adjacent to the first FS-BEOL metallization structure of the first IC die; and
  electrically coupling at least one first substrate interconnect among one or more first substrate interconnects in a first metal interconnect layer of the first FS-BEOL metallization structure of the first IC die coupled to the first semiconductor layer, to the package substrate.

23. The method of any one of aspects 18 to 22, wherein forming the first IC die comprises:
  forming the first BS-BEOL metallization structure on a substrate such that a first surface of the first BS-BEOL metallization structure is disposed adjacent to a first surface of the substrate; and
  further comprising:
    forming a carrier wafer on a second surface of the first BS-BEOL metallization structure opposite the first surface of the first BS-BEOL metallization structure;
    forming the first semiconductor layer on a second surface of the substrate opposite the first surface of the substrate;
    forming the first FS-BEOL metallization structure adjacent to the first semiconductor layer; and
    removing the carrier wafer from the first BS-BEOL metallization structure.

24. The method of aspect 23, further comprising thinning before forming the first semiconductor layer on the second surface of the substrate opposite the first surface of the substrate.

25. The method of any one of aspects 23 to 24, further comprising forming one or more conductive bumps adjacent to the first FS-BEOL metallization structure coupled to one or more first substrate interconnects in a first metal interconnect layer of the first BS-FEOL metallization structure.

26. The method of any one of aspects 21 to 22, further comprising coupling a third IC die to the at least one via.

What is claimed is:

1. An integrated circuit (IC) package, comprising:
  a first IC die comprising:
    a first front side (FS)-back-end-of-line (BEOL) (FS-BEOL) metallization structure;
    a first back side (BS)-BEOL (BS-BEOL) metallization structure; and
    a first semiconductor layer disposed between the first FS-BEOL metallization structure and the first BS-BEOL metallization structure; and
  a second IC die, comprising:
    a second FS-BEOL metallization structure adjacent to the first BS-BEOL metallization structure;
    a second BS-BEOL metallization structure; and
    a second semiconductor layer disposed between the second FS-BEOL metallization structure and the second BS-BEOL metallization structure.

2. The IC package of claim 1, further comprising an IC package;
  the first FS-BEOL metallization structure of the first IC die adjacent to a package substrate.

3. The IC package of claim 1, wherein the second IC die is disposed above the first IC die in a vertical direction.

4. The IC package of claim 1, wherein:
  the first BS-BEOL metallization structure of the first IC die comprises a first metal interconnect layer comprising one or more first die interconnects electrically coupled to the first semiconductor layer;
  the second FS-BEOL metallization structure of the second IC die comprises a second metal interconnect layer comprising one or more second die interconnects electrically coupled to the second semiconductor layer; and
  at least one of one or more first die interconnects coupled to at least one of the one or more second die interconnects.

5. The IC package of claim 4, wherein the first FS-BEOL metallization structure of the first IC die comprises a third metal interconnect layer comprising one or more third die interconnects electrically coupled to the first semiconductor layer.

6. The IC package of claim 5, further comprising:
  a package substrate comprising one or more substrate interconnects;
  the first FS-BEOL metallization structure of the first IC die adjacent to the package substrate;
  at least one substrate interconnect among the one or more substrate interconnects electrically coupled to at least one first die interconnect among the one or more first die interconnects; and
  further comprising one or more conductive bumps electrically coupled to the one or more substrate interconnects.

7. The IC package of claim 4, wherein:
  the first BS-BEOL metallization structure of the first IC die further comprises one or more first vertical interconnect accesses (vias) electrically coupled to the one or more first die interconnects and the first semiconductor layer; and
  the second FS-BEOL metallization structure of the second IC die further comprises one or more second vias electrically coupled to the one or more second die interconnects and the second semiconductor layer.

8. The IC package of claim 1, wherein the first FS-BEOL metallization structure of the first IC die comprises a third metal interconnect layer comprising one or more third die interconnects electrically coupled to the first semiconductor layer.

9. The IC package of claim 1, further comprising an intermediate metallization structure disposed between the first BS-BEOL metallization structure of the first IC die and the second FS-BEOL metallization structure of the second IC die.

10. The IC package of claim 9, wherein:
the first BS-BEOL metallization structure of the first IC die comprises a first metal interconnect layer comprising one or more first die interconnects electrically coupled to the first semiconductor layer;
the second FS-BEOL metallization structure of the second IC die comprises a second metal interconnect layer comprising one or more second die interconnects electrically coupled to the second semiconductor layer;
the intermediate metallization structure comprises at least one intermediate metal interconnect layer comprising one or more intermediate interconnects;
at least one of the one or more first die interconnects is coupled to at least one of the one or more intermediate interconnects; and
at least one of the one or more second die interconnects is coupled to at least one of the one or more intermediate interconnects to electrically couple the at least one of the one or more first die interconnects to the at least one of the one or more second die interconnects.

11. The IC package of claim 10, wherein the first FS-BEOL metallization structure of the first IC die comprises a third metal interconnect layer comprising one or more third die interconnects electrically coupled to the first semiconductor layer.

12. The IC package of claim 9, further comprising:
a third IC die, comprising:
a third FS-BEOL metallization structure adjacent to the first BS-BEOL metallization structure;
a third BS-BEOL metallization structure; and
a third semiconductor layer disposed between the third FS-BEOL metallization structure and the third BS-BEOL metallization structure;
the third IC die disposed adjacent in a lateral direction to the second IC die and separated from the second IC die by a gap distance to form a void region between the second IC die and the third IC die; and
the intermediate metallization structure comprises at least one intermediate metallization layer comprising one or more intermediate interconnects.

13. The IC package of claim 12, further comprising a via disposed in the void region and electrically coupled to at least one of the one or more intermediate interconnects in the intermediate metallization structure.

14. The IC package of claim 13, further comprising a fourth IC die comprising a fourth semiconductor layer, the fourth IC die disposed adjacent to the second IC die;
the via electrically coupled to the fourth semiconductor layer.

15. The IC package of claim 12, wherein:
the first BS-BEOL metallization structure of the first IC die comprises a first metal interconnect layer comprising one or more first die interconnects electrically coupled to the first semiconductor layer; and
at least one of the one or more first die interconnects is coupled to at least one of the one or more of the intermediate interconnects.

16. The IC package of claim 9, wherein the intermediate metallization structure comprises one or more redistribution layers (RDLs).

17. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. The IC package of claim 1, wherein:
the first BS-BEOL metallization structure comprises a first metal interconnect layer; and
the second FS-BEOL metallization structure comprises a second metal interconnect layer coupled to the first metal interconnect layer.

19. The IC package of claim 18, wherein:
The first BS-BEOL metallization structure comprises a plurality of first metal interconnect layers; and
the second FS-BEOL metallization structure comprises a plurality of second metal interconnect layers; and
at least one first metal interconnect layer of the plurality of first metal interconnect layers is coupled to at least one second metal interconnect layer of the plurality of second metal interconnect layers.

20. The IC package of claim 1, further comprising:
a third IC die, comprising:
a third FS-BEOL metallization structure adjacent to the first BS-BEOL metallization structure;
a third BS-BEOL metallization structure; and
a third semiconductor layer disposed between the third FS-BEOL metallization structure and the third BS-BEOL metallization structure;
the third IC die disposed adjacent in a lateral direction to the second IC die and separated from the second IC die by a gap distance to form a void region between the second IC die and the third IC die.

21. The IC package of claim 20, further comprising a via disposed in the void region and electrically coupled to first BS-BEOL metallization structure.

22. A method of fabricating an integrated circuit (IC) package, comprising:
forming a first IC die, comprising:
forming a first back side (BS) back-end-of-line (BEOL) (BS-BEOL) metallization structure;
forming a first semiconductor layer adjacent to the first BS-BEOL metallization structure; and
forming a first front side (FS)-BEOL (FS-BEOL) metallization structure adjacent to the first semiconductor layer wherein the first semiconductor layer is disposed between the first BS-BEOL metallization structure and the first FS-BEOL metallization structure; and
forming a second IC die, comprising:
forming a second BS-BEOL metallization structure;
forming a second semiconductor layer adjacent to the second BS-BEOL metallization structure; and
forming a second FS-BEOL metallization structure adjacent to the second semiconductor layer wherein the second semiconductor layer is disposed between the second BS-BEOL metallization structure and the second FS-BEOL metallization structure.

23. The method of claim 22, further comprising bonding the second IC die to the first IC die.

24. The method of claim 23, further comprising:
forming an intermediate metallization structure adjacent to the second FS-BEOL metallization structure of the second IC die; and
coupling at least one intermediate interconnect among one or more intermediate interconnects in an intermediate metal interconnect layer of the intermediate metallization structure to at least one first die interconnect among one or more first die interconnects of the first FS-BEOL metallization structure of the first IC die.

25. The method of claim 24, further comprising:
coupling at least one via to the at least one intermediate interconnect among the one or more intermediate interconnects; and
removing a mold compound on the first IC die to expose a top surface of the at least one via.

26. The method of claim 25, further comprising coupling a third IC die to the at least one via.

27. The method of claim 24, further comprising:
forming a package substrate adjacent to the first FS-BEOL metallization structure of the first IC die; and
electrically coupling at least one first substrate interconnect among one or more first substrate interconnects in a first metal interconnect layer of the first FS-BEOL metallization structure of the first IC die coupled to the first semiconductor layer, to the package substrate.

28. The method of claim 22, wherein forming the first IC die comprises:
forming the first BS-BEOL metallization structure on a substrate such that a first surface of the first BS-BEOL metallization structure is disposed adjacent to a first surface of the substrate; and
further comprising:
forming a carrier wafer on a second surface of the first BS-BEOL metallization structure opposite the first surface of the first BS-BEOL metallization structure;
forming the first semiconductor layer on a second surface of the substrate opposite the first surface of the substrate;
forming the first FS-BEOL metallization structure adjacent to the first semiconductor layer; and
removing the carrier wafer from the first BS-BEOL metallization structure.

29. The method of claim 28, further comprising thinning before forming the first semiconductor layer on the second surface of the substrate opposite the first surface of the substrate.

30. The method of claim 28, further comprising forming one or more conductive bumps adjacent to the first FS-BEOL metallization structure coupled to one or more first substrate interconnects in a first metal interconnect layer of the first BS-FEOL metallization structure.

* * * * *